(12) United States Patent
Hirota et al.

(10) Patent No.: US 6,400,404 B2
(45) Date of Patent: *Jun. 4, 2002

(54) SOLID-STATE IMAGING DEVICE AND CAMERA USING THE SAME

(75) Inventors: Isao Hirota; Masaharu Hamasaki, both of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/893,509

(22) Filed: Jul. 11, 1997

(30) Foreign Application Priority Data

| Jul. 12, 1996 | (JP) | 8-182974 |
| Jan. 8, 1997 | (JP) | 9-001060 |
| Mar. 10, 1997 | (JP) | 9-054355 |

(51) Int. Cl.[7] ............................................. H04N 5/335
(52) U.S. Cl. ........................................ 348/314; 348/316
(58) Field of Search ................................ 348/314, 317, 348/319, 320, 322, 311, 312, 169, 170, 316, 315; 257/242; H04N 5/335

(56) References Cited

U.S. PATENT DOCUMENTS

| 4,426,664 A | * | 1/1984 | Nagumo et al. | 348/324 |
| 4,492,980 A | * | 1/1985 | Harada | 348/314 |
| 4,884,144 A | * | 11/1989 | Jinnai et al. | 358/228 |
| 4,975,777 A | * | 12/1990 | Lee et al. | 348/314 |
| 5,196,939 A | * | 3/1993 | Elabd et al. | 348/314 |
| 5,272,535 A | * | 12/1993 | Elabd et al. | 348/314 |
| 5,412,422 A | * | 5/1995 | Yamada et al. | 348/218 |
| 5,450,129 A | * | 9/1995 | Matoba et al. | 348/294 |
| 5,486,859 A | * | 1/1996 | Matsuda | 348/311 |
| 5,510,836 A | * | 4/1996 | Stekelenburg | 348/299 |
| 5,572,256 A | * | 11/1996 | Egawa et al. | 348/312 |
| 5,612,739 A | * | 3/1997 | Maki et al. | 348/311 |
| 5,652,622 A | * | 7/1997 | Hynecek | 348/311 |
| 5,719,625 A | * | 2/1998 | Tani | 348/241 |
| 5,784,103 A | * | 7/1998 | Pine et al. | 348/312 |
| 5,801,850 A | * | 9/1998 | Maki et al. | 358/483 |

FOREIGN PATENT DOCUMENTS

| JP | 404373276 A | * | 12/1992 | H04N/5/335 |

* cited by examiner

*Primary Examiner*—Tuan Ho
(74) *Attorney, Agent, or Firm*—Sonnenschein, Nath & Rosenthal

(57) ABSTRACT

Control gate sections capable of prohibiting transfer from vertical CCDs to a horizontal CCD of signal charges generated in selected regions of an imaging area in the horizontal direction are provided between the vertical CCDs to the horizontal CCD. This configuration allows reading of signal charges only in a particular region in the horizontal direction. As a result, high-speed imaging can be realized without increasing the drive frequency.

24 Claims, 33 Drawing Sheets

FIG. 14
(1) OPB READING    | | D2 | D3 | |
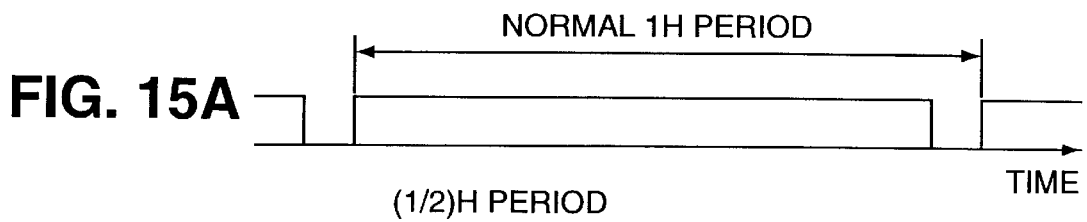
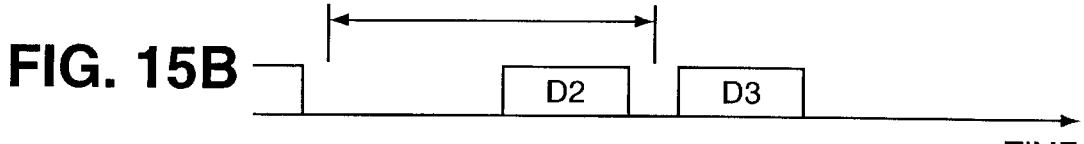
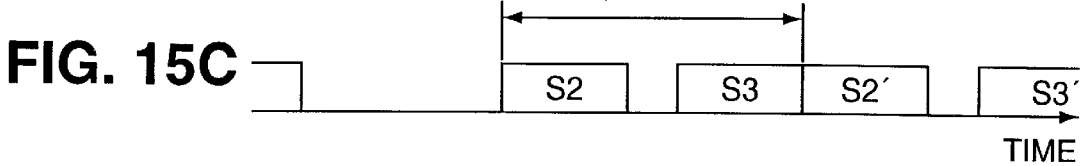

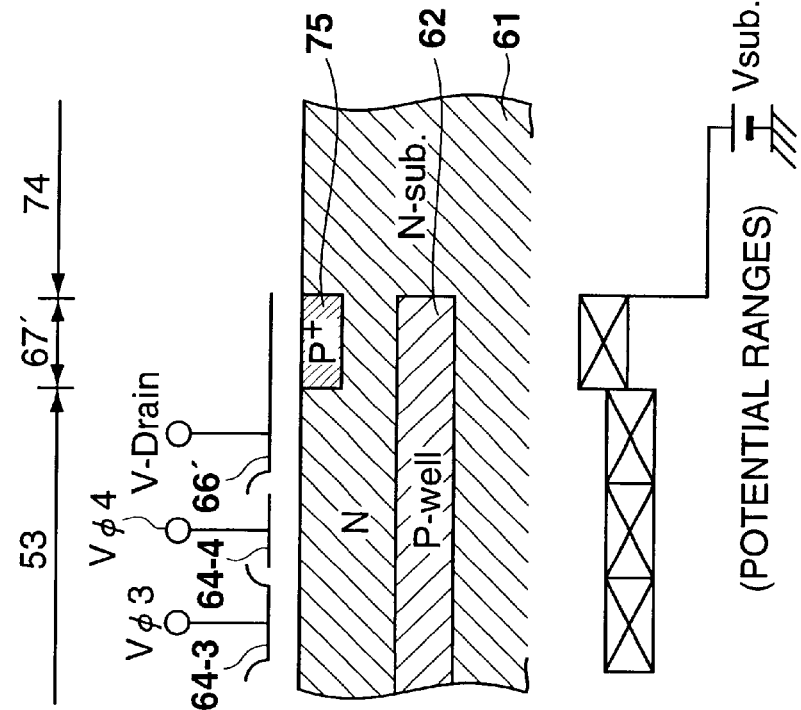
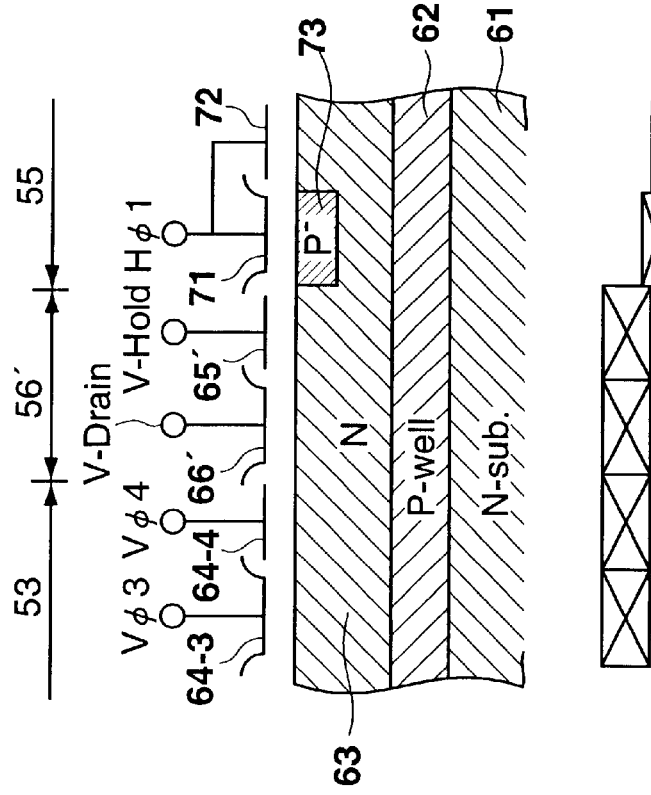

HORIZONTAL/INTERMEDIATE HORIZONTAL BLANKING PERIOD

HORIZONTAL BLANKING PERIOD

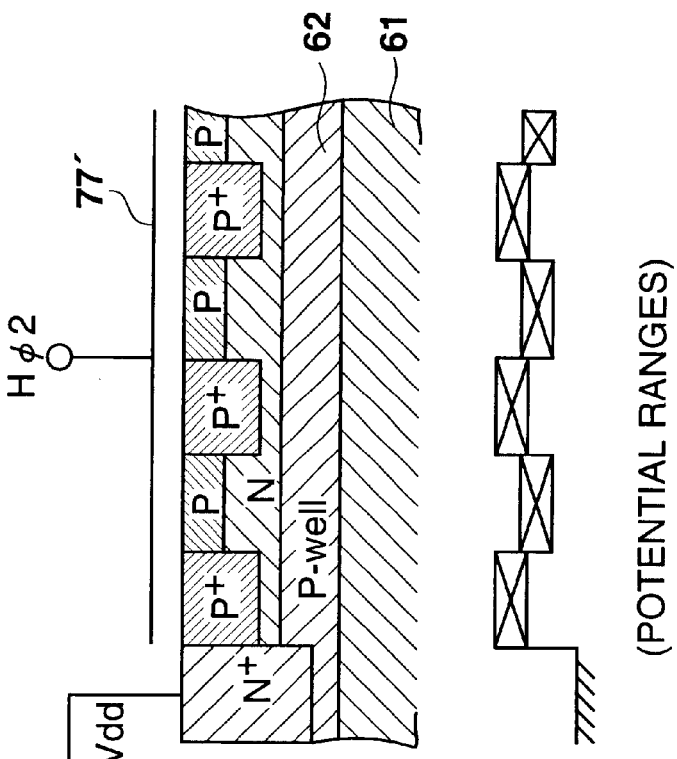
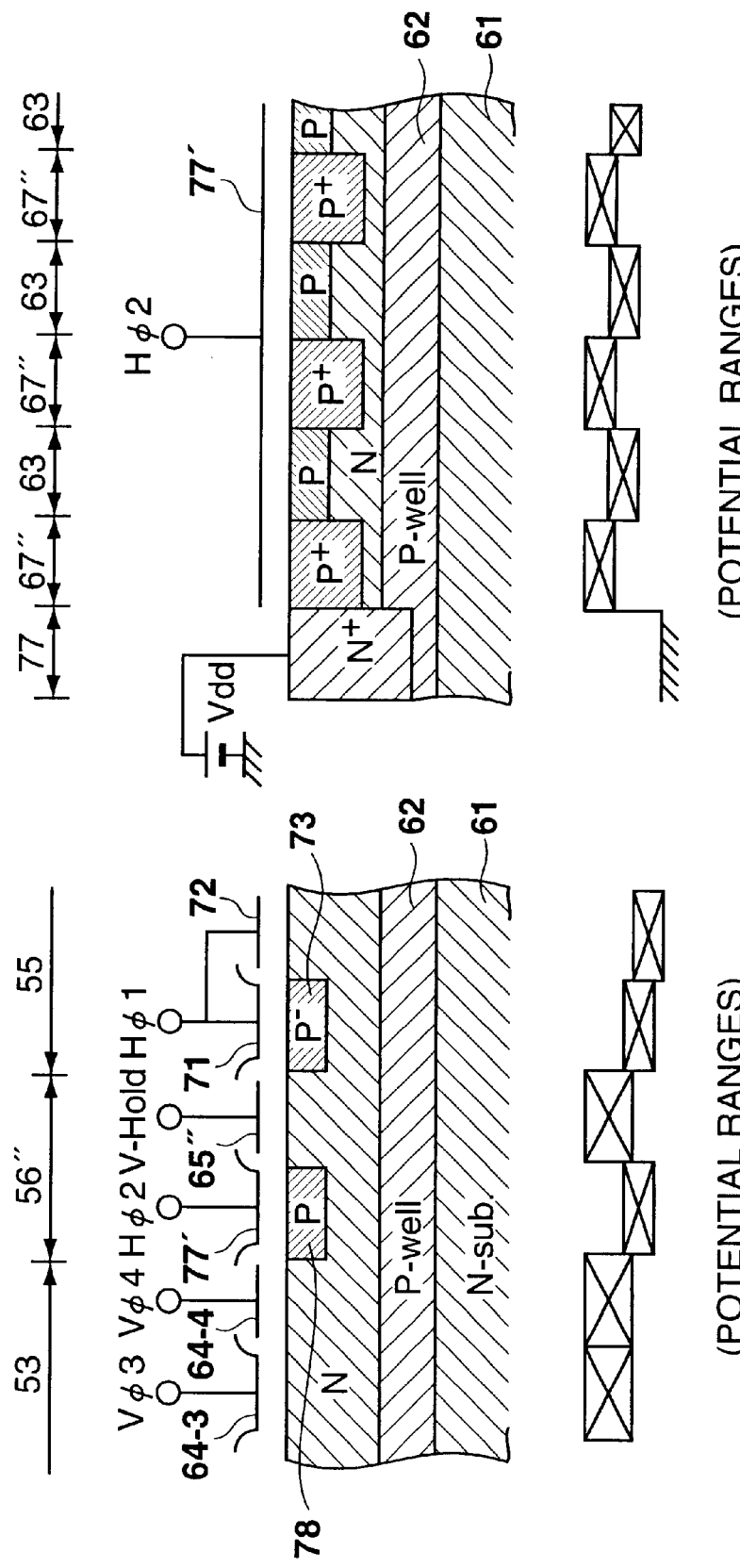
FIG. 38A
FIG. 38B

SOLID-STATE IMAGING DEVICE AND CAMERA USING THE SAME

BACKGROUND OF THE INVENTION

1. Field of the Invention

The present invention relates to a solid-state imaging device and a camera and, more specifically, to a solid-state imaging device suitable for high-speed imaging and a camera using such a solid-state imaging device as an imaging device.

2. Description of the Related Art

Conventionally, in a high-speed imaging mode of a business-use camera or the like, n-fold-speed imaging is realized by simply increasing the drive frequency of a solid-state imaging device to n times that in a normal imaging mode.

On the other hand, as shown in FIG. 1, a CCD solid-state imaging device of what is called an all pixels independent reading type which is capable of independently reading out signal charges of all pixels is equipped with two systems of horizontal transfer sections 101 and 102 for the purpose of serially outputting signal charges of two lines at the same time without changing the horizontal transfer frequency. It has been proposed to realize, for instance, a 4-fold-speed imaging mode by utilizing the above function.

However, in the former case, the drive frequency of the solid-state imaging device is increased by a factor of n, a post-stage signal processing system and a recording device need to be adapted accordingly and hence become very expensive. Thus, there is a problem that a consumer-use camera becomes very expensive if it employs this type of scheme.

In the latter case, an n-fold-speed operation can be realized without increasing the drive frequency or the like of a solid-state imaging device. However, in the case of a 4-fold-speed imaging mode, for instance, the imaging center (indicated by mark "x" in FIG. 1) is shifted to a bottom-left position in an imaging area 103 as shown in FIG. 1, which means a deviation of the optical center. This causes a problem that a camera is very poor in ease of operation in performing optical zooming, for instance.

SUMMARY OF THE INVENTION

The present invention has been made in view of the above problems in the art, and an object of the invention is therefore to provide a solid-state imaging device which can realize high-speed imaging without increasing the drive frequency in a state that the center of an imaging area coincides with the optical center, as well as to provide a camera incorporating such a solid-state imaging device.

According to one aspect of the invention, there is provided a solid-state imaging device comprising a plurality of sensor sections arranged in matrix form, for performing photoelectric conversion; a reading section for reading signal charges obtained through the photoelectric conversion in the plurality of sensor sections; vertical transfer sections for vertically transferring signal charges read out from the sensor sections by the reading section; a horizontal transfer section for horizontally transferring signal charges moved from the vertical transfer sections; and a transfer control section capable of preventing transfer of signal charges from the vertical transfer sections to the horizontal transfer section in a partial region in a horizontal direction.

In the solid-state imaging device having the above configuration, in a normal imaging mode, signal charges read out from the plurality of sensor sections by the reading section are moved to the horizontal transfer section as they are and then horizontally transferred there. On the other hand, in a high-speed imaging mode, part of signal charges read out to the vertical transfer sections in the partial region, for instance, both end regions, in the horizontal direction, are prevented by the transfer control section from being transferred to the horizontal transfer section. Signal charges generated only in the central region in the horizontal direction are moved to the horizontal transfer section and then horizontally transferred there.

According to another aspect of the invention, there is provided a solid-state imaging device comprising a plurality of sensor sections arranged in matrix form, for performing photoelectric conversion; a reading section for reading signal charges obtained through the photoelectric conversion in the plurality of sensor sections, the reading section being capable of reading out signal charges only in a partial region in a vertical direction; vertical transfer sections for vertically transferring signal charges read out from the sensor sections by the reading section; and a horizontal transfer section for horizontally transferring signal charges moved from the vertical transfer sections.

In the solid-state imaging device having the above configuration, in a normal imaging mode, signal charges in all sensor sections are read out to the vertical transfer sections by the reading section and output via the horizontal transfer section. On the other hand, in a high-speed imaging mode, signal charges only in the partial region in the vertical direction are read out to the vertical transfer sections by the reading section and output via the horizontal transfer section. As a result, there is no need for performing an operation of vertically transferring at high speed signal charges in the other region in the vertical direction.

According to a further aspect of the invention, there is provided a solid-state imaging device comprising an imaging area having a plurality of sensor sections arranged in matrix form for performing photoelectric conversion, and vertical transfer sections for vertically transferring signal charges read out from the sensor sections; and an optical black area having a plurality of sensor sections that are optically shielded, and vertical transfer sections for vertically transferring charges read out from the sensor sections, the optical black area being disposed at a given interval from the imaging area.

In the solid-state imaging device having the above configuration, since the optical black area is disposed at a given interval from the imaging area, a blank area is interposed in between. The existence of the blank area prevents leakage of light due to, for instance, inclined incidence of light on sensor sections in a peripheral portion of the optical black area. In addition, the optical black area can be used as a wiring area.

BRIEF DESCRIPTION OF THE DRAWINGS

FIG. 14 is an operation chart showing the operation in the 4-fold-speed imaging mode in the first embodiment;

FIGS. 15A–15C show output waveforms in the 4-fold-speed imaging mode;

FIGS. 25A and 25B are sectional views of the main part of the third embodiment taken along lines III–III' and IV–IV' in FIG. 24, respectively;

FIG. 38 are sectional views of the main part of the modification of the fourth embodiment taken along lines VII–VII' in FIG. 37, respectively;

DESCRIPTION OF THE PREFERRED EMBODIMENTS

Embodiments of the present invention will be hereinafter described in detail with reference to the accompanying drawings. Although the following description will be directed to a case of applying the invention to a CCD (charge coupled device) solid-state imaging device, the invention is not limited to such a case and the invention is generally applicable to solid-state imaging devices having a structure in which signal charges read out from sensor sections are subjected to vertical-horizontal transfer (parallel-serial transfer).

Figure 1:
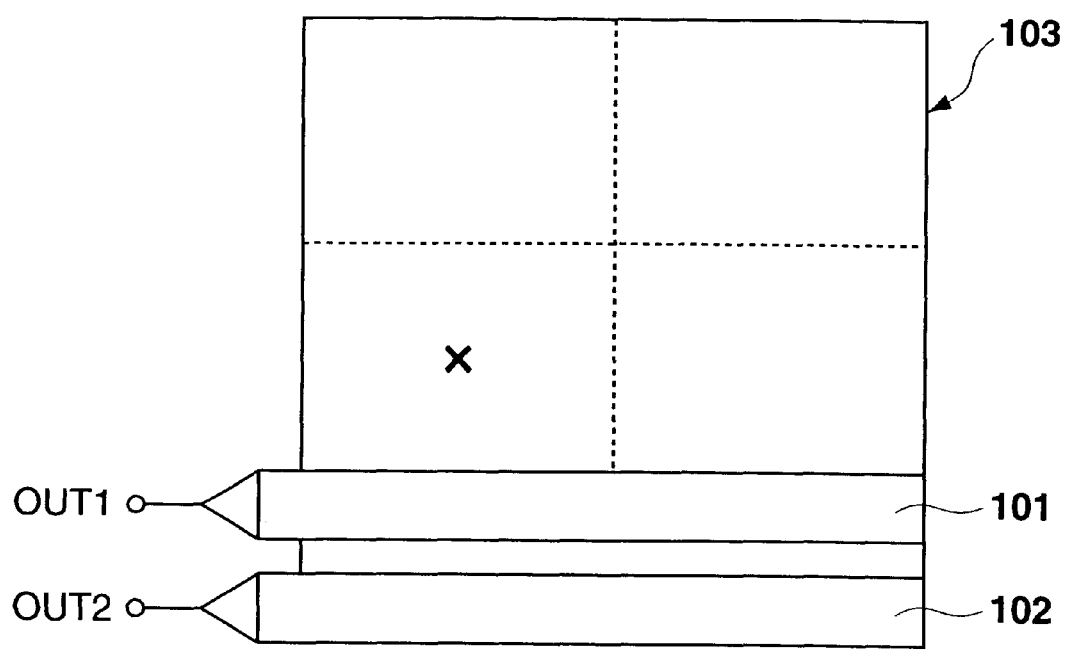
FIG. 1 illustrates problems of conventional solid-state imaging devices and cameras.
Figure 2:
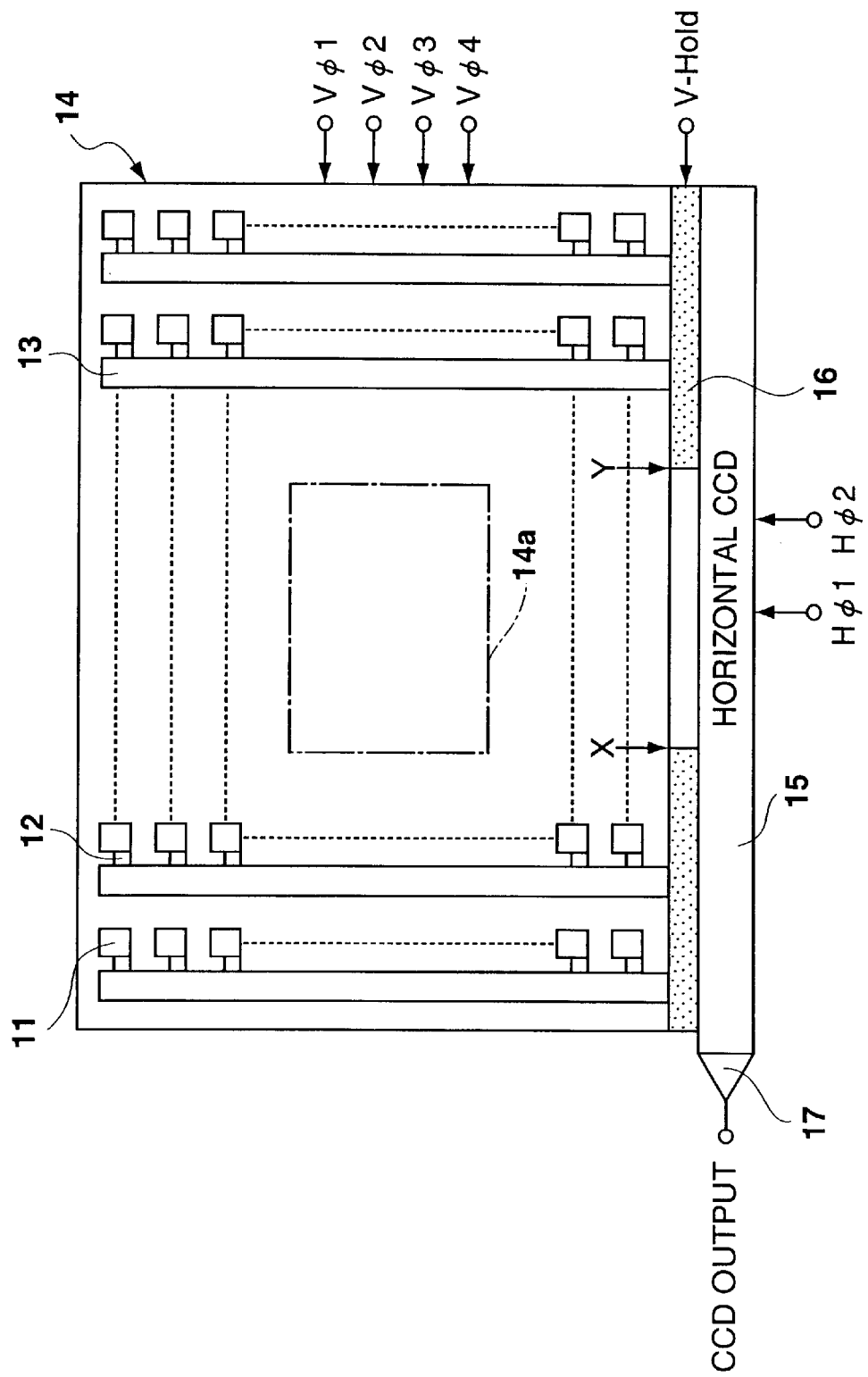
FIG. 2 shows a general configuration of a first embodiment of the present invention.

FIG. 2 shows a general configuration of a first embodiment in which the invention is applied to an interline transfer type CCD solid state imaging device, for instance. As shown in FIG. 2, an imaging area 14 is constituted of a plurality of sensor sections 11 and a plurality of vertical CCDs 13. Arranged in the row (horizontal) and column (vertical) directions, i.e., in matrix form, the sensor sections 11 convert incident light into signal charges of amounts corresponding to light quantities of the incident light, and accumulate the signal charges thus produced. Provided for each vertical column of the sensor sections 11, each vertical CCD 13 vertically transfers signal charges read out from the sensor sections 11 by respective read gate sections 12.

In the imaging area 14, each sensor section 11 is a pn-junction photodiode, for instance. A signal charge accumulated in each sensor section 11 is read out to the associated vertical CCD 13 when a read pulse XSG (described later) is applied to the associated read gate section 12. The vertical CCDs 13 are transfer-driven by 4-phase vertical transfer clock signals $V\phi1$–$V\phi4$, for instance, and sequentially transfer portions of read-out signal charges in the vertical direction such that each portion corresponding to one scanning line (one line) is transferred in a portion of each horizontal blanking period.

In the vertical CCDs 13, first-phase and third-phase transfer electrodes also serve as gate electrodes of the read gate sections 12. Therefore, among the 4-phase vertical transfer clock signals $V\phi1$–$V\phi4$, the first-phase transfer clock signal $V\phi1$ and the third-phase transfer clock signal $V\phi3$ are set to have three values: a low level (hereinafter referred as L-level), a medium level (M-level), and a high level (H-level). A pulse of the third-value level, i.e., the H-level, serves as a read pulse XSG for the read gate sections 12.

A horizontal CCD 15 is disposed under the imaging area 14 (as viewed in FIG. 2). Signal charges are sequentially transferred from the plurality of vertical CCDs 13 to the horizontal CCD 15 such that signal charges corresponding to one line are transferred each time. Transfer-driven by 2-phase horizontal transfer clock signals H$\phi$1 and H$\phi$2, for instance, the horizontal CCD 15 sequentially transfers, in the horizontal direction, signal charges transferred from the vertical CCDs 13 such that signal charges of one line are transferred in a horizontal scanning period after the preceding horizontal blanking period.

Control gate sections (transfer control section) 16 are provided between the vertical CCDs 13 and the horizontal CCD 15. To prohibit transfer of signal charges from the vertical CCDs 13 to the horizontal CCD 15 selectively, i.e., in certain regions in the horizontal direction, both end regions in this example, the control gate sections 16 are provided to occupy both end regions in the horizontal direction in the imaging area 14.

In a normal imaging mode, the control gate sections 16 transfer, as they are, all of signal charges supplied from the vertical CCDs 13 line by line to the horizontal CCD 15. On the other hand, in a high-speed imaging mode, among signal charges supplied from the vertical CCDs 13 line by line, the control gate sections 16 transfer signal charges only in the central region to the horizontal CCD 15 while prohibiting signal charges in both end regions in the horizontal direction from being transferred to the horizontal CCD 15. A specific configuration of the control gate sections 16 will be described later in detail.

A charge-to-voltage conversion section 17 having a configuration of a floating diffusion amplifier, for instance, is provided at a transfer destination end of the horizontal CCD 15. The charge-to-voltage conversion section 17 sequentially converts signal charges that are horizontally transferred by the horizontal CCD 15 into a voltage signal and outputs it. The voltage signal is output as a CCD output signal which corresponds to the amount of incident light coming from an object.

Figure 3:
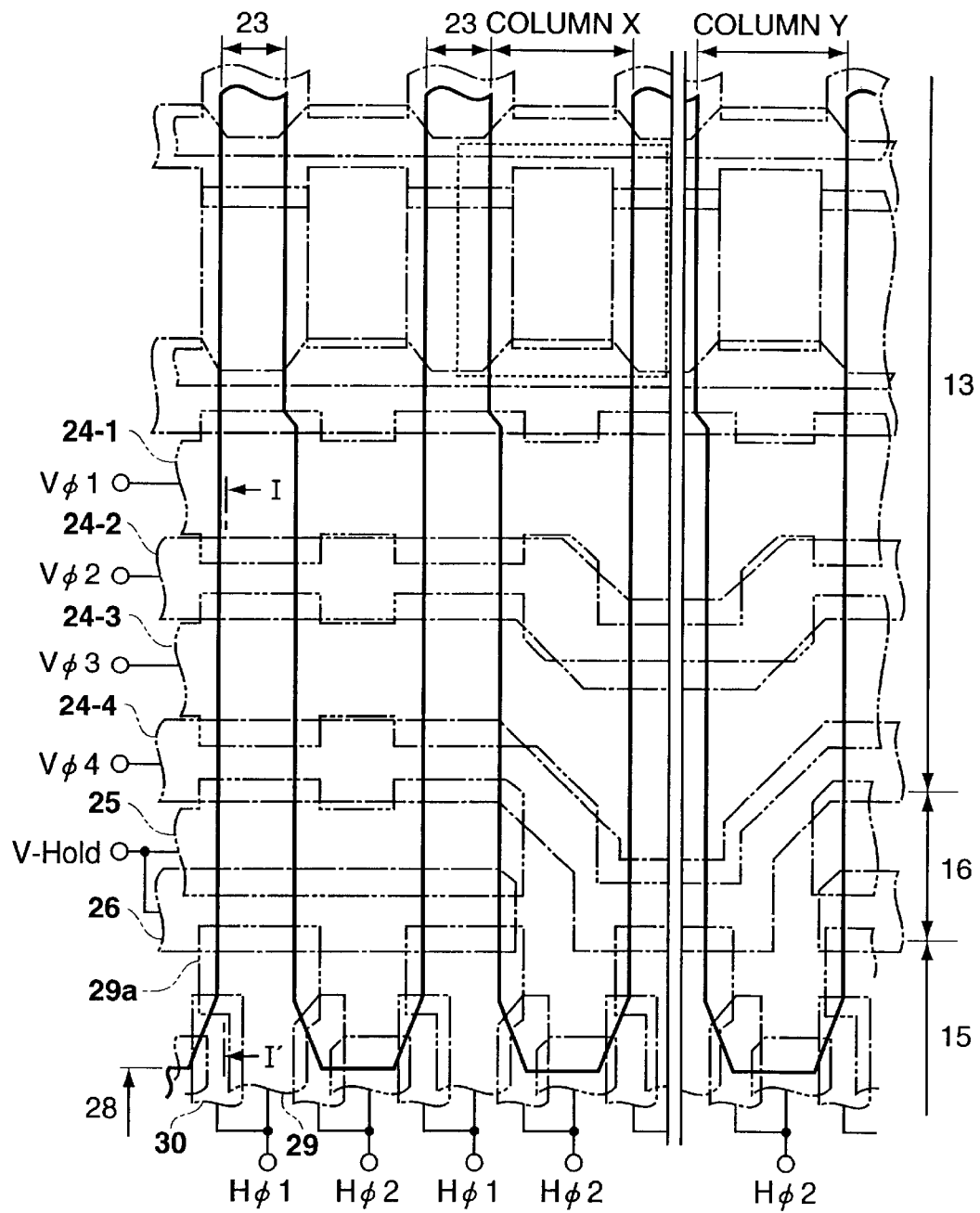
FIG. 3 shows a plan pattern of control gate sections of the first embodiment.
Figure 4:
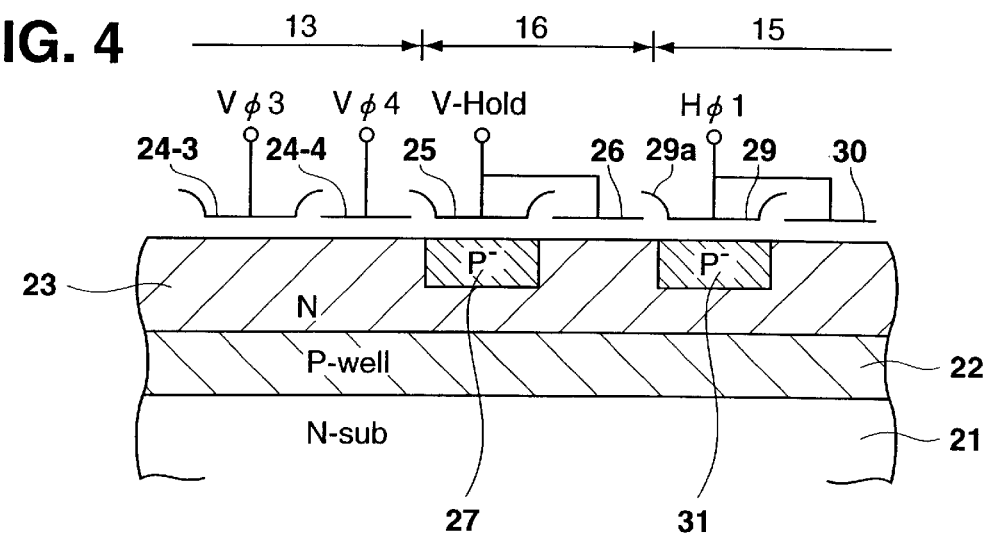
FIG. 4 is a sectional view taken along line I–I' and viewed from the side of arrows in FIG. 3.

FIG. 3 is a plan pattern diagram showing a specific configuration of peripheral portions of the control gate sections 16, and FIG. 4 is a sectional view taken along line I–I' and viewed from the side of arrows in FIG. 4. In FIG. 3, column X corresponds to a vertical column X at the boundary of the left-hand control gate section 16 shown in FIG. 2 and column Y corresponds to a vertical column Y at the boundary of the right-hand control gate section 16. A configuration between columns X and Y is omitted.

Each vertical CCD 13 is constituted of a transfer channel 23 of an n-type impurity which is formed on an n-type substrate 21 through a p-type well 22, and 4-phase transfer electrodes 24-1 to 24-4 that are arranged above the transfer channel 23 so as to be repeated in the transfer direction of the transfer channel 23. The transfer electrodes 24-1 and 24-4 have a 2-layer electrode structure in which the second-phase transfer electrode 24-2 and the fourth-phase transfer electrode 24-4 are formed as first-layer polysilicon electrodes (indicated by one-dot chain lines in FIG. 3) and the first-phase transfer electrode 24-1 and the third-phase transfer electrode 24-3 are formed as second-layer polysilicon electrodes (indicated by two-dot chain lines in FIG. 3).

Each control gate section 16 is constituted of a transfer electrode 25 and a storage electrode 26 which are arranged in order in the transfer direction and to which a control voltage V-Hold is applied. To conform to the two-layer structure of the vertical CCD 13, the electrodes 25 and 26 have a two-layer electrode structure in which the storage electrode 26 is formed as a first-layer polysilicon electrode (indicated by a one-dot chain line in FIG. 3) and the transfer electrode 25 is formed as a second-layer polysilicon electrode (indicated by a two-dot chain line in FIG. 3). Further, a p$^-$-type impurity layer 27 is formed in a surface portion of the transfer channel 23 under the transfer electrode 25.

The horizontal CCD 15 is constituted of a transfer channel 28 of an n-type impurity and electrode pairs of a transfer electrode 29 and a storage electrode 30 that are arranged above the transfer channel 28 so as to be repeated in the transfer direction of the transfer channel 28. The electrodes 29 and 30 also have a two-layer electrode structure in which the storage electrode 30 is formed as a first-layer polysilicon electrode (indicated by a one-dot chain line in FIG. 3) and the transfer electrode 29 is formed as a second-layer polysilicon electrode (indicated by a two-dot chain line in FIG. 3).

A p$^-$-type impurity layer 31 is formed in a surface portion of the transfer channel 28 under the transfer electrode 29. Horizontal transfer clock signals H$\phi$1 and H$\phi$2 are alternately applied to the electrode pairs which are arranged repeatedly. A vertical CCD 13 side end portion 29a of the transfer electrode 29 located on an extension of the transfer channel 23 of each vertical CCD 13 is so formed as to extend to a position above the storage electrode 26 of the control gate section 16.

As seen from FIG. 2, the above-configured control gate sections 16 occupy both right-hand and left-hand portions of the imaging area 14 excluding a central portion 14a. In a normal imaging mode, a control voltage V-Hold of a H-level (corresponds to the M-level of the vertical transfer clock signals V$\phi$1–V$\phi$4) is applied to the transfer electrode 25 and the storage electrode 26. As a result, the potential of the control gate sections 16 becomes deep, whereby signal charges are transferred as they are from the vertical CCDs 13 to the horizontal CCD 15.

On the other hand, in a high-speed imaging mode, the control voltage V-Hold is changed to a L-level. As a result, the potentials in the control gate sections 16 become shallow, whereby signal charges are prohibited from being transferred from the vertical CCDs 13 to the horizontal CCD 15. Signal charges only in the central portion 14a can be read out. The potential of the control gate sections 16 in a state that the control voltage V-Hold is at the L-level is so set as to prevent signal charges from overflowing to the horizontal CCD 15 during a transfer through the vertical CCDs 13.

Figure 5:
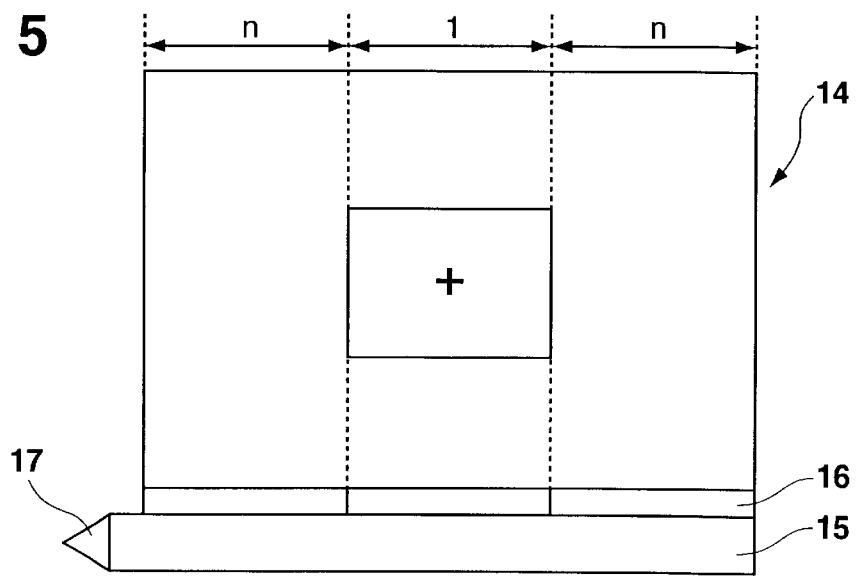
FIG. 5 illustrates regions where the control gate sections are disposed.

In the overall horizontal length of the imaging area 14, assume that the ratio between the length of the region where transfer of signal charges from the vertical CCDs 13 to the horizontal CCD 15 is prohibited, i.e., the region where the control gate section 16 is disposed and the length of the region where transfer of signal charges is not prohibited, i.e., the region where the control gate sections 16 are not disposed is set at about n:1:n as shown in FIG. 5. In this case, with an assumption that the aspect ratio is 4:3, for instance, high-speed imaging operations of 4-fold speed, 9-fold speed, and 25-fold speed can be realized by setting n at 0.5, 1, and 2, respectively. If the aspect ratio may be a ratio other than 4:3, high-speed imaging of variable speed can be obtained by controlling the number of high-speed transfer stages of the vertical CCDs 13 in a vertical blanking period.

The total length of the regions where the control gate sections 16 are disposed (i.e., the regions where transfer of signal charges is prohibited) is set ½ or more, preferably ⅔ or more, of the overall horizontal length of the imaging area 14. In other words, the length of the region where the control gate sections 16 are not disposed (i.e., the region where signal charges are transferred) is set less than ½, preferably less than ⅓, of the overall horizontal length of the imaging area 14.

For example, the total number of bits of the transfer-prohibited region on the front side in the horizontal direction (left side in FIG. 5) plus the empty feed portion immediately before an optical black area (hereinafter abbreviated as "OPB") on the front side in the horizontal direction is set at about n times (n: integer≧1) the number of bits of a transfer-enabled region of the central portion 14a plus an OPB number. The OPB will be described later in detail.

By disposing the control gate sections 16 to satisfy the above condition, when signal charges of one line are transferred from the vertical CCDs 13 to the horizontal CCD 15 in a high-speed imaging mode, blank bits more than the number of bits of the read-out signal charges can be secured in regions of the horizontal CCD 15 under the control gate sections 16. Therefore, the read-out charges can be stored in the black bit regions under the control gate sections 16 until signal charges of the next line are read out after the shifting of the read-out signal charges.

Next, a description will be made of how the above-configured CCD solid-state imaging device operates in the normal imaging mode and the high-speed imaging mode.

Figure 6:
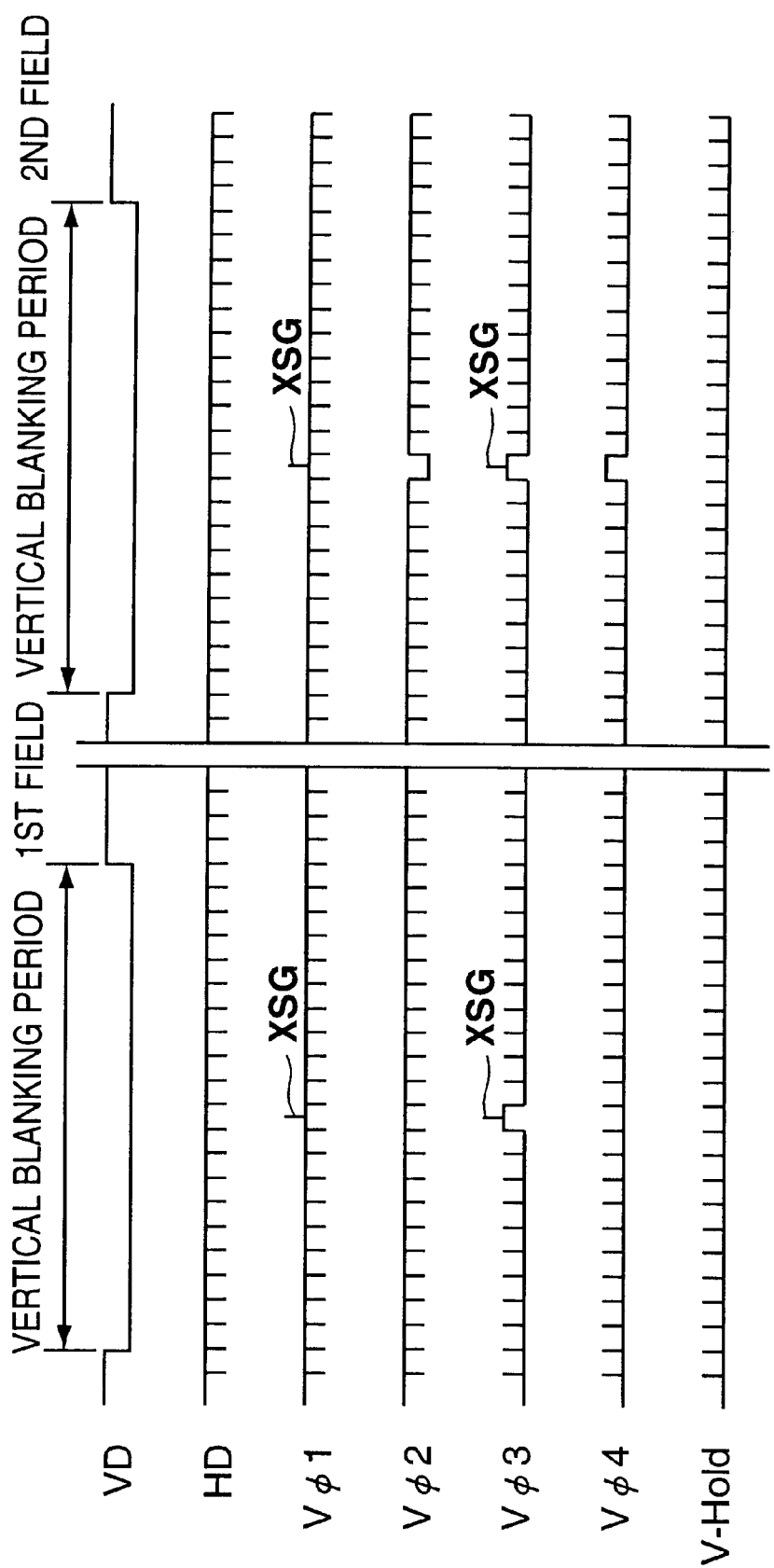
FIG. 6 is a timing chart (1) showing an operation in a normal imaging mode in the first embodiment.
Figure 7:
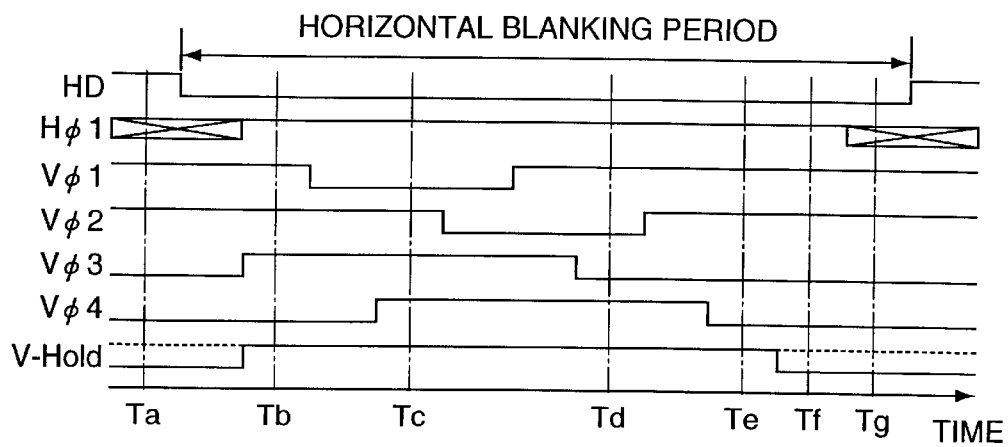
FIG. 7 is a timing chart (2) showing the operation in the normal imaging mode in the first embodiment.
Figure 8:
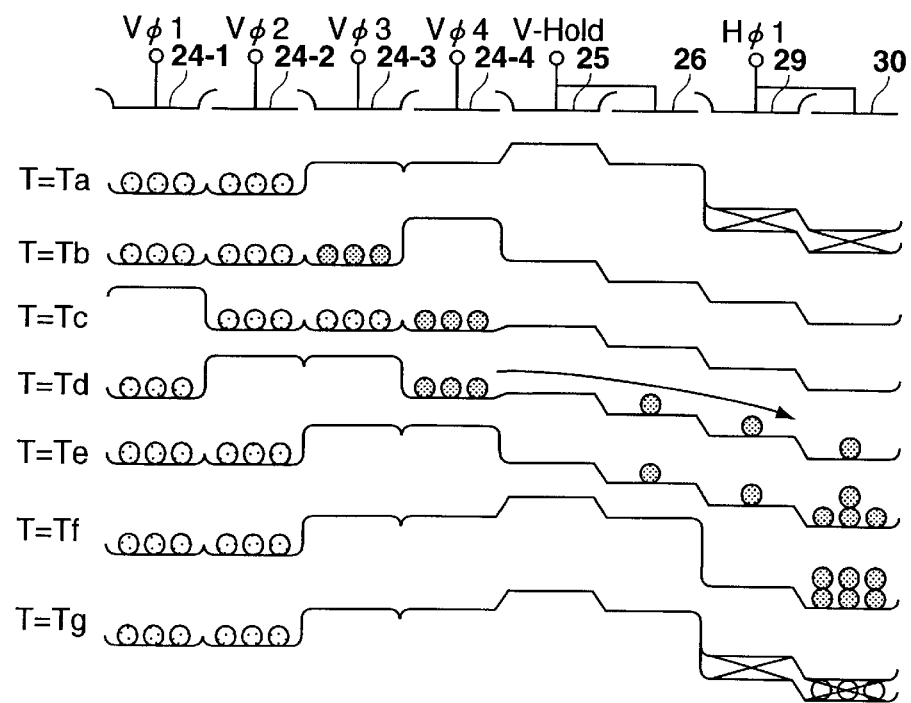
FIG. 8 is a potential diagram showing the operation in the normal imaging mode in the first embodiment.

First, an operation in the normal imaging mode will be described with reference to timing charts of FIGS. 6 and 7 and a potential diagram of FIG. 8. The potential diagram of FIG. 8 shows potential profiles under the respective electrodes of the vertical CCD 13 and the control gate section 16 at time points Ta–Tg shown in FIG. 7.

First, when read pulses XSG occur in vertical transfer clock signals Vφ1 and Vφ3 at a certain time point in a vertical blanking period during which a vertical sync signal VD (see FIG. 6) is at a L-level, signal charges are read out from the respective sensor sections 11 to the vertical CCDs 13 by the read gate sections 12 and signal charges of two pixels that are adjacent to each other in the vertical direction are mixed in the vertical CCDs 13. Combinations of two pixels vertically adjacent to each other that are to be mixed in the first field are different than in the second field.

Then, at time Ta which is immediately before the start of a horizontal blanking period during which a horizontal sync signal HD (see FIG. 7) is at a L-level, the vertical transfer clock signals Vφ1 and Vφ2 are at the M-level (medium level among the 3-value levels). Therefore, the potentials under the first-phase and second-phase transfer electrodes 24-1 and 24-2 are deep and hence signal charges of two pixels vertically adjacent to each other that have been read out from the sensor sections 11 are stored in this packet. At this time point, since the vertical transfer clock signals Vφ3 and Vφ4 are at the L-level and the control voltage V-Hold is at the L-level, the potentials under the third-phase and fourth-phase transfer electrodes 24-3 and 24-4 and the electrodes 25 and 26 of the control gate section 16 are shallow.

Subsequently, at time Tb in the horizontal blanking period, the vertical transfer clock Vφ3 is changed to the M-level and hence the potential under the third-phase transfer electrode 24-3 becomes deep. Therefore, part of the signal charges stored under the first-phase and second-phase transfer electrodes 24-1 and 24-1 move to the position under the third-phase transfer electrode 24-3. At this time point, since the control voltage V-Hold is changed to the H-level (equal to the M-level of the vertical transfer clock signals Vφ1–Vφ4), the potentials under the electrodes 25 and 26 of the control gate section 16 also become deep.

At time Tc, since the vertical transfer clock signal Vφ1 is changed to thee L-level and the vertical transfer clock signal Vφ4 is changed to the M-level, the potential under the first-phase transfer electrode 24-1 becomes shallow and the potential under the transfer electrode 24-4 becomes deep. Therefore, the signal charges stored under the first-phase to third-phase transfer electrodes 24-1 to 24-3 move to the positions under the second-phase to fourth-phase transfer electrodes 24-2 to 24-4.

At time Td, since the vertical transfer clock signals Vφ1 and Vφ4 are at the M-level and the vertical transfer clock signals Vφ2 and Vφ3 are at the L-level, the potentials under the first-phase and fourth-phase transfer electrodes 24-1 and 24-4 are deep and the potentials under the second-phase and third-phase transfer electrodes 24-2 and 24-3 are shallow. At this time point, since the potentials under the electrodes 25 and 26 of the control gate section 16 are deep, the signal charges stored under the second-phase and third-phase transfer electrodes 24-2 and 24-3 move to the horizontal CCD 15 via the position under the fourth-phase transfer electrode 24-4 and the control gate section 16.

At time Te, since the vertical transfer clock signal Vφ2 is changed to the M-level and the vertical transfer clock signal Vφ4 is changed to the L-level, the potential under the second-phase transfer electrode 24-2 becomes deep and the potential under the fourth-phase transfer electrode 24-4 becomes shallow. Therefore, the signal charge stored under the fourth-phase transfer electrode 24-4 also moves to the horizontal CCD 15 via the control gate section 16. At time Tf, since the control voltage V-Hold is changed to the L-level, the potentials under the electrodes 25 and 26 of the control gate section 16 become shallow. At time Tg, horizontal transfer is effected in the horizontal CCD 15.

Next, an operation in a 9-fold-speed imaging mode will be described with reference to a timing chart of FIG. 9 and an operation chart of FIG. 10. In the 9-fold-speed imaging operation, since n is equal to 1 in FIG. 5, a reading area 14a is a central portion of the imaging area 14 that occupies ⅓ of the overall horizontal length and ⅓ of the overall vertical length.

Figure 9:
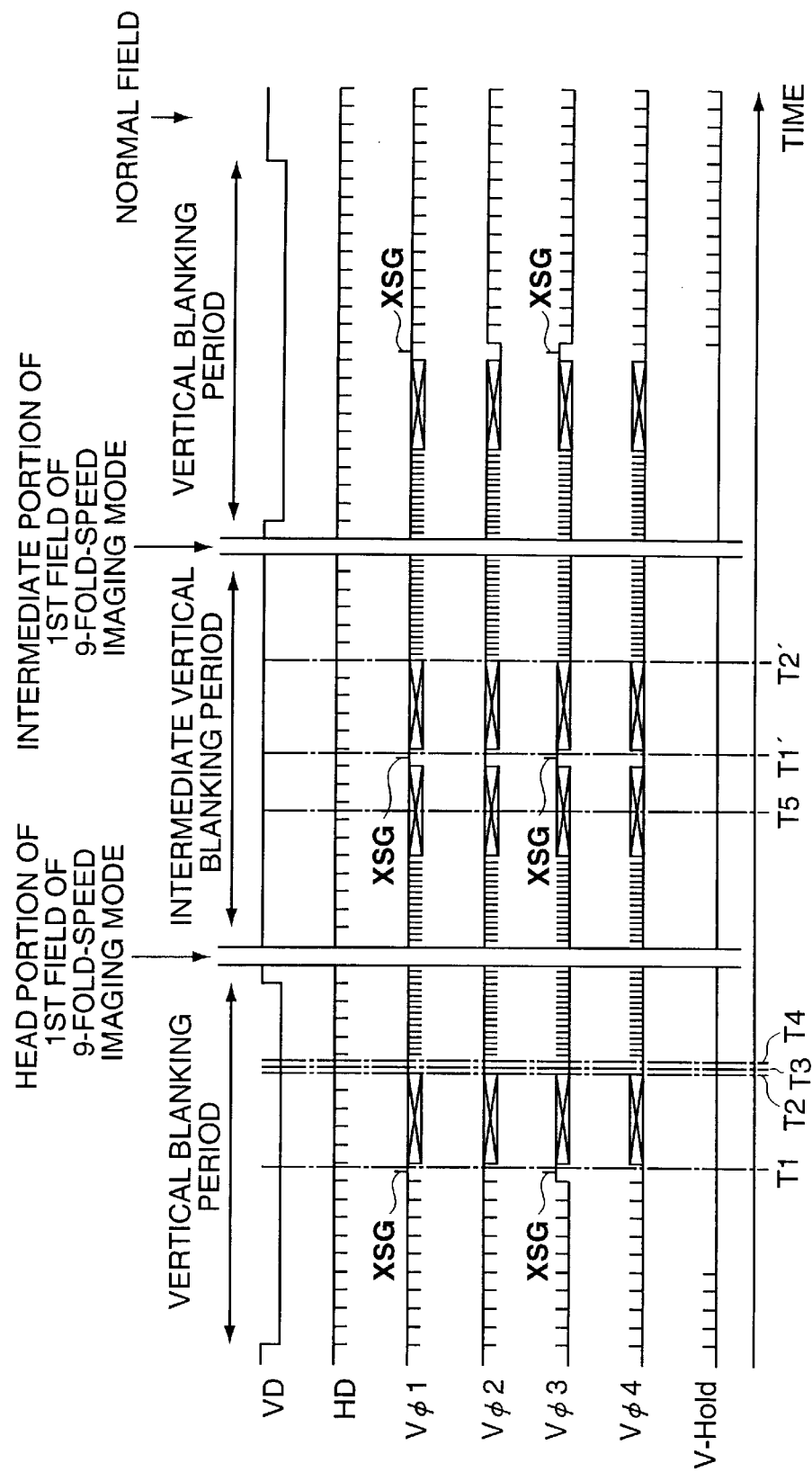
FIG. 9 is a timing chart (1) showing an operation in a 9-fold-speed imaging mode in the first embodiment.
Figure 10:
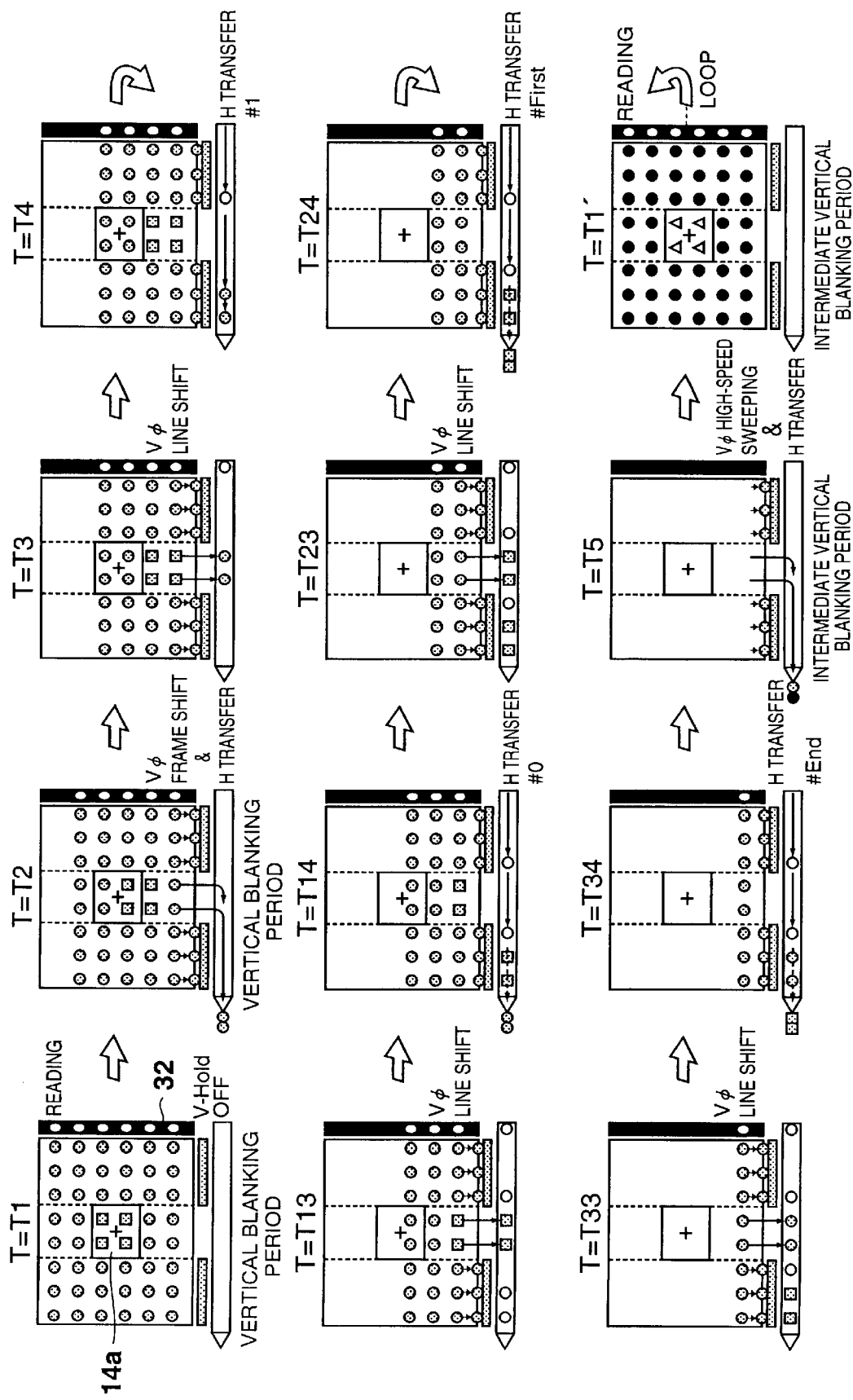
FIG. 10 is an operation chart showing the operation in the 9-fold-speed imaging mode in the first embodiment.

The operation chart of FIG. 10 shows operation states of the vertical CCDs 13, the control gate sections 16, and the horizontal CCD 15 at time points T1–T5 shown in FIG. 9. In FIG. 10, mark "○" indicates unnecessary charges in regions outside the reading area 14a and mark "□" indicates charges to be read out in the reading area 14a. A black-band region on the right of the imaging area 14 indicates an OPB 32 where sensor sections are shielded from light over a plurality of columns.

First, when read pulses XSG occur in the vertical transfer clock signals Vφ1 and Vφ3 at a certain time point in a vertical blanking period during which the vertical sync signal VD (see FIG. 9) is at the L-level, signal charges are read out from the respective sensor sections 11 to the vertical CCDs 13 by the read gate sections 12 and signal charges of two pixels that are adjacent to each other in the vertical direction tare mixed in the vertical CCDs 13. Combinations of two pixels vertically adjacent to each other that are to be mixed in the first field are different than in the second field.

Then, at time T2, high-frequency vertical transfer clock signals Vφ1–Vφ4 are applied to the respective electrodes of the vertical CCDs 13, whereby high-speed vertical transfer is effected only in lines of about ⅓ of the overall length under the reading area 14a. Since the control voltage V-Hold is at the L-level and hence the potentials under the control gate sections 16 are shallow from a time point before the signal charge reading, the potential barriers of the control gate sections 16 prevent signal charges in both end portions excluding the central ⅓ portion in the horizontal direction from being transferred to the horizontal CCD 15. The transfer preventing operation by means of the control gate sections 16 will be described later in detail. Signal charges in the central ⅓ portion in the horizontal direction are transferred to the horizontal CCD 15 and swept to the outside via the horizontal CCD 15.

At time T3 which is immediately after completion of the vertical high-speed transfer, signal charges generated in a central ⅓ portion in the horizontal direction of the line right under the reading area 14*a* are transferred to the horizontal CCD 15. At this time point, charges in the OPB 32 are also transferred to the horizontal CCD 15. Then, at time T4, the signal charges transferred to the horizontal CCD 15 are horizontally transferred by ⅓ of the line length. Thereafter, the operations of time T3 and time T4 are repeated. In the following description, time points when the same operation as at time T3 are denoted by T13, T23, and T33, and time points when the same operation as at time T4 are denoted by T14, T24, and T34.

That is, at time T13, signal charges generated in the first line of the reading area 14*a* are transferred to the horizontal CCD 15 together with charges generated in the OPB 32. At time T14, the signal charges generated in the first line of the reading area 14*a* and the charges generated in the OPB 32 and now existing in the horizontal CCD 15 are horizontally transferred by ⅓ of the line length. At this time, the charges that were previously transferred from the OPB 32 to the horizontal CCD 15 and horizontally transferred by ⅓ of the line length are added behind the signal charges generated in the first line of the reading area 14*a*.

Then, at time T23, signal charges generated in the second line of the reading area 14*a* are transferred to the horizontal CCD 15 together with charges generated in the OPB 32. At time T24, the signal charges generated in the second line of the reading area 14*a* and the charges generated in the OPB 32 and now existing in the horizontal CCD 15 are horizontally transferred by ⅓ of the line length. At this time, the charges that were previously transferred from the OPB 32 to the horizontal CCD 15 and horizontally transferred by ⅓ of the line length are added behind the signal charges generated in the second line of the reading area 14*a*.

To simplify the description, FIG. 10 is drawn in a schematic manner with an assumption that the reading area 14*a* has only two lines. The same operations as at the time points T3 and T4 are performed one time even after the signal charges of all the lines of the reading area 14*a* have been transferred to the horizontal CCD 15 (time points T33 and T34). As a result of these operations, charges generated in the OPB 32 added behind signal charges generated in the last line of the reading area 14*a*, and those charges are output from the horizontal CCD 15 to the charge-to-voltage conversion section 17.

At time T5 in an intermediate vertical blanking period that is set in a period that should otherwise be a vertical effective period, high-speed vertical transfer is effected only in lines of about ⅓ of the overall length above the reading area 14*a*. After completion of this high-speed vertical transfer, read pulses XSG occur in the vertical transfer clock signals Vϕ1 and Vϕ3, whereby signal charges of the next field are read out from the respective sensor sections 11 to the vertical CCDs 13 by the read gate sections 12.

Figure 11:
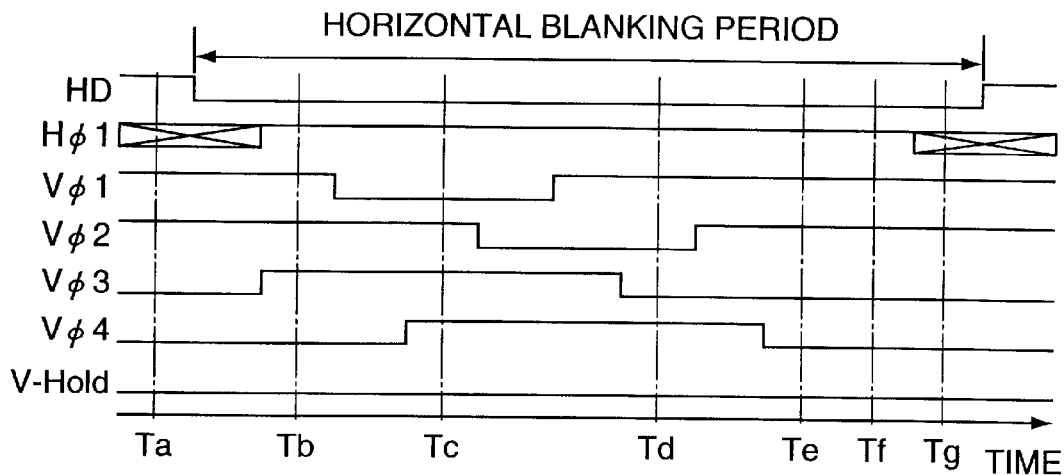
FIG. 11 is a timing chart (2) showing the operation in the 9-fold-speed imaging mode in the first embodiment.
Figure 12:
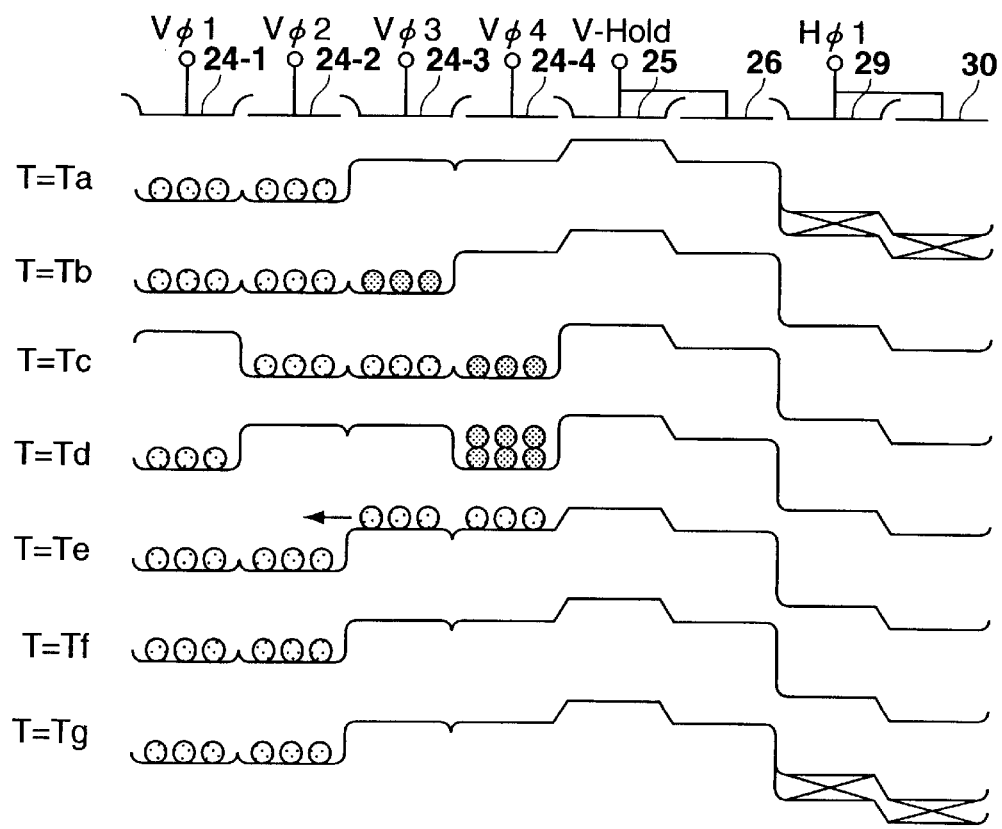
FIG. 12 is a potential diagram showing the operation in the 9-fold-speed imaging mode in the first embodiment.

Next, a description will be made of a detailed operation of the control gate sections 16 in the high-speed imaging mode (9-fold-speed imaging mode in this example) with reference to a timing chart of FIG. 11 and a potential diagram of FIG. 12. The potential diagram of FIG. 12 shows potential profiles under the electrodes of the vertical CCD 13 and the control gate section 16 at time points Ta–Tg shown in FIG. 11.

At time Ta which is immediately before the start of a horizontal blanking period during which the horizontal sync signal HD (see FIG. 11) is at the L-level, the vertical transfer clock signals Vϕ1 and Vϕ2 are at the M-level (medium level among the 3-value levels). Therefore, the potentials under the first-phase and second-phase transfer electrodes 24-1 and 24-2 are deep and hence signal charges of two pixels vertically adjacent to each other that have been read out from the sensor sections 11 are stored in this packet. At this time point, since the vertical transfer clock signals Vϕ3 and Vϕ4 are at the L-level and the control voltage V-Hold is at the L-level, the potentials under the third-phase and fourth-phase transfer electrodes 24-3 and 24-4 and the electrodes 25 and 26 of the control gate section 16 are shallow.

Subsequently, at time Tb in the horizontal blanking period, the vertical transfer clock Vϕ3 is changed to the M-level and hence the potential under the third-phase transfer electrode 24-3 becomes deep. Therefore, part of the signal charges stored under the first-phase and second-phase transfer electrodes 24-1 and 24-1 move to the position under the third-phase transfer electrode 24-3. At this time point, since the control voltage V-Hold is kept at the L-level, the potentials under the electrodes 25 and 26 of the control gate section 16 are shallow.

At time Tc, since the vertical transfer clock signal Vϕ1 is changed to the L-level and the vertical transfer clock signal Vϕ4 is changed to the M-level, the potential under the first-phase transfer electrode 24-1 becomes shallow and the potential under the transfer electrode 24-4 becomes deep. Therefore, the signal charges stored under the first-phase to third-phase transfer electrodes 24-1 to 24-3 move to the positions under the second-phase to fourth-phase transfer electrodes 24-2 to 24-4.

At time Td, since the vertical transfer clock signals Vϕ1 and Vϕ4 are at the M-level and the vertical transfer clock signals Vϕ2 and Vϕ3 are at the L-level, the potentials under the first-phase and fourth-phase transfer electrodes 24-1 and 24-4 are deep and the potentials under the second-phase and third-phase transfer electrodes 24-2 and 24-3 are shallow. At this time point, the signal charges stored under the second-phase and third-phase transfer electrodes 24-2 and 24-3 are prevented from being transferred to the horizontal CCD 15 by the potential barrier of the control gate section 16 and come to be stored under the fourth-phase transfer electrode 24-4.

At time Te, since the vertical transfer clock signal Vϕ2 is changed to the M-level and the vertical transfer clock signal Vϕ4 is changed to the L-level, the potential under the second-phase transfer electrode 24-2 becomes deep and the potential under the fourth-phase transfer electrode 24-4 becomes shallow. Therefore, the signal charges stored under the fourth-phase transfer electrode 24-4 move backward and come to be stored under the first-phase and second-phase transfer electrodes 24-1 and 24-2. Then, the time elapses past Tf to Tg. At time Tg, horizontal transfer is effected in the horizontal CCD 15.

As described above, the control gate sections (transfer control section) 16 capable of prohibiting transfer of signal charges from the vertical CCDs 13 to the horizontal CCD 15 selectively, i.e., in the partial regions in the horizontal direction, are provided between the imaging area 14 and the horizontal CCD 15. And in the high-speed imaging mode, the transfer of signal charges from the vertical CCDs 13 to the horizontal CCD 15 is prohibited, for instance, in both end portions in the horizontal direction. By virtue of this configuration, transferred charges in the regions of the horizontal CCD 15 corresponding to the above transfer-prohibited regions can be prevented from destruction.

As a result, where parameter n is set at 1, for instance, in FIG. 5, immediately after signal charges of an about ⅓ line that have been transferred from the vertical CCDs 13 to the horizontal CCD 15 are transferred to the positions under the control gate section 16 in a (⅓)H period, signal charges of the next line can be transferred to the horizontal CCD 15. By performing this operation three times consecutively in a 1H period, high-speed of imaging of 3-fold horizontal speed can be realized without increasing the drive frequency of the horizontal CCD 15. The unnecessariness for increasing the drive frequency is advantageous also in terms of power consumption.

Further, since the regions in the horizontal direction where the transfer of signal charges from the vertical CCDs 13 to the horizontal CCD 15 are both end portions of the imaging area 14, signal charges in the central portion (in this example, the reading area 14a shown in FIG. 5) of the imaging area 14 are always read out. Therefore, the imaging center is not shifted to a corner of the imaging area 14; that is, it is possible to realize high-speed imaging that is always performed on the optical axis.

Next, the operation in a 4-fold-speed imaging mode will be described. In the 4-fold-speed imaging mode, parameter n is set at 0.5 in FIG. 5. Therefore, as indicated by a one-dot-chain line in FIG. 13, a portion of the imaging area 14 that occupies ½ of the overall horizontal length and ½ of the overall vertical length is made a reading area 14b. In this example, it is assumed that OPBs 14c and 14d each being of one or a plurality of lines are provided in both top and bottom portions (or only in the bottom portion) of the imaging area 14. It is also assumed that an overflow control gate section 41 and an overflow drain section 42 for sweeping unnecessary charges are provided on the side of the horizontal CCD 15 opposite the imaging area 14.

Figure 13:
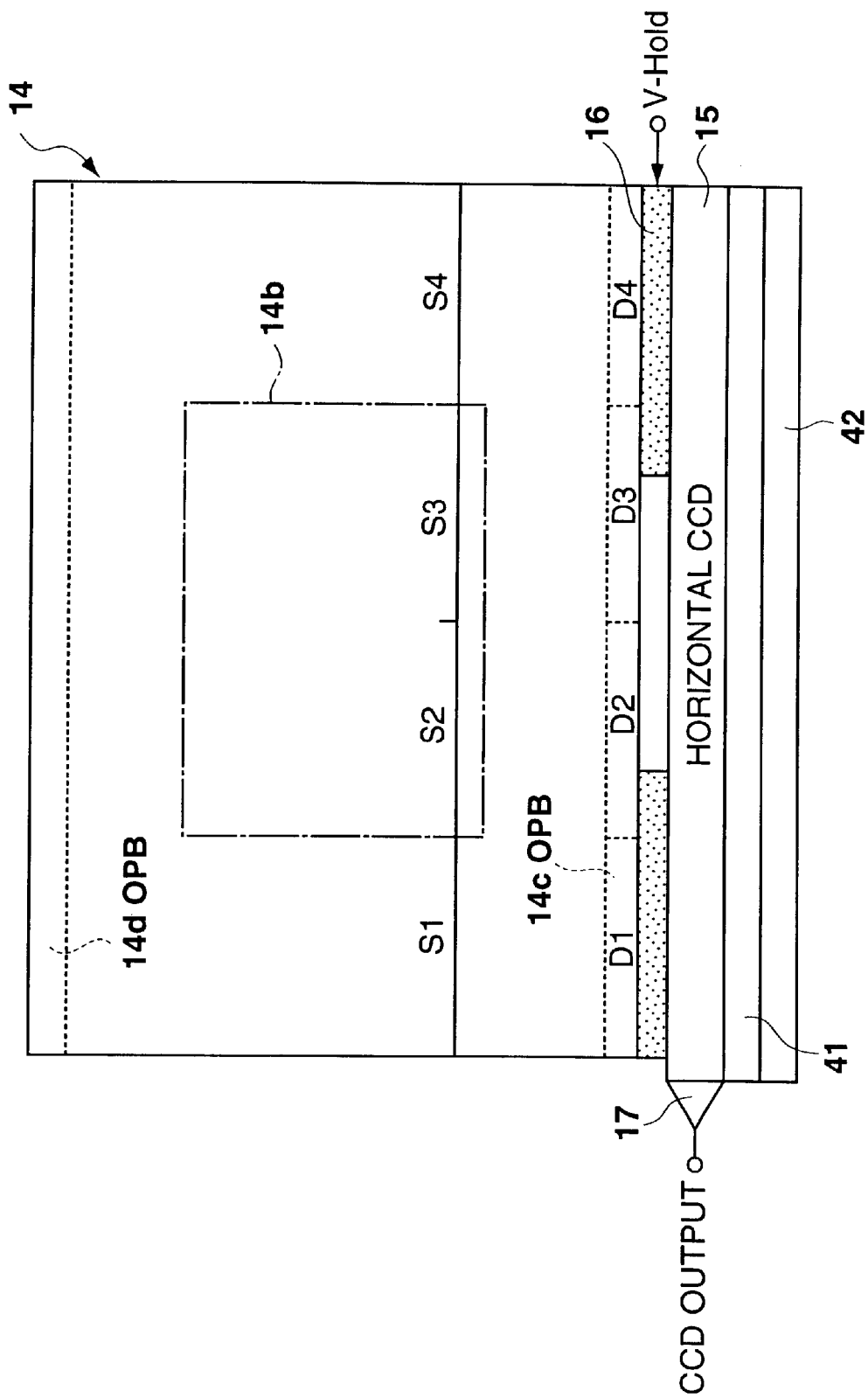
FIG. 13 shows a general configuration for a 4-fold-speed imaging mode.

In FIG. 13, the overall imaging area 14 is horizontally divided into four parts. Signal charges in the respective divisional regions of the bottom OPB 14c of the imaging area 14 are denoted by D1–D4 and signal charges in the respective divisional regions in the rest of the imaging area 14 are denoted by S1–S4. Since the basic operation in the 4-fold-speed imaging mode is the same as in the 9-fold-speed imaging mode, in the following a detailed description using a timing chart will be omitted and only the concept of the operation will be described with reference to an operation chart of FIG. 14.

In the 4-fold-speed imaging mode, as in the case of the 9-fold-speed imaging mode, the control voltage V-Hold is at the L-level and hence the potentials in the control gate sections 16 are shallow. Therefore, signal charges in both end portions excluding the central portion occupying ½ of the overall horizontal length are prohibited from being transferred to the horizontal CCD 15. First, in this state, signal charges D2 and D3 in the OPB 14c are line-shifted into the horizontal CCD 15 (step (1)).

The horizontal CCD 15 is then transfer-driven for a (½)H period, so that the signal charges D2 are output via the charge-to-voltage conversion section 17 while the charges D3 remain in the horizontal CCD 15 (step (2)). Then, the horizontal CCD 15 is again transfer-driven for a (½)H period, so that the signal charges D3 are output via the charge-to-voltage conversion section 17 and the horizontal CCD 15 becomes empty (step (3)). FIG. 15B shows an output waveform of the charge-to-voltage conversion section 17 during the course of the above operation. Where the OPB 14c is of a plurality of lines, steps (1) and (2) of FIG. 14 are repeated.

Then, since signal charges in lines of about ¼ of the overall length under the reading area 14b are unnecessary, they are vertically transferred at high speed and swept into the overflow drain section 42 via the horizontal CCD 15. At this time, since signal charges in both end portions of the imaging area 14 are unnecessary irrespective of the position in the vertical direction, the control gate sections 16 may be either in a transfer prohibiting state or in a transfer enabling state. If they are in the transfer enabling state, signal charges generated in both end portions of the imaging area 14 are also swept into the overflow drain section 42.

Subsequently, for the reading area 14b, with the control gate sections 16 rendered in the transfer prohibiting state, signal charges S2 and S3 generated in the first line are line-shifter to the horizontal. CCD 15 (step (4)). The horizontal CCD 15 is then transfer-driven for a (½)H period, so that the signal charges S2 are output via the charge-to-voltage conversion section 17 and the signal charges D3 remain in the horizontal CCD 15 (step (5)).

Then, signal charges S2' and S3' generated in the second line in the reading area 14b are line-shifted to the horizontal CCD 15 (step (6)). At this time point, the signal charges S3 of the first line and the signal charges S2' and S3' of the next line are arranged in order in the horizontal CCD 15. Thereafter, steps (4)–(6) of FIG. 4 are repeated. Thus, the signal charges only in the central portion of the imaging area 14, i.e., the reading area 14b, can be extracted at 4-fold-speed without increasing the transfer frequency. FIG. 15C shows an output waveform of the above operation.

After completion of the output of the signal charges generated in the reading area 14b, unnecessary charges above the reading area 14b are vertically transferred at high speed and then swept into the overflow drain section 42 via the horizontal CCD 15, in the same manner as unnecessary charges below the reading area 14b were done previously. Then, signal charges in the OPB 14d in the top portion of the imaging area 14 are output in the same manner as signal charges D2 and D3 in the bottom OPB 14c were done previously.

Incidentally, when a high-speed sweeping operation is performed, there may occur an event that dark current of the vertical CCDs 13 in an upper portion of the imaging area 14 is different from that in a lower portion. In such a case, an interpolation value obtained from an output signal based on signal charges of the OPB 14c at the bottom portion of the imaging area 14 and an output signal based on signal charges of the top OPB 14d may be used as a reference level of a video signal.

As seen from each of the output waveforms of FIGS. 15B and 15C, a signal of a ½ line is so output as to bridge two adjacent (½)H periods. However, most of current video cameras using a CCD solid-state imaging device as an imaging device are digital ones and incorporate a line memory. Each output data may be written to the line memory with the timing of FIG. 15B or 15C, and may be read out with proper timing (with a delay of (¼)H) when it is used. Thus, there occur no problems in an imaging operation.

As for output data of the OPBs 14c and 14d, output data based on signal charges that are free of a smear component may be written to an OPB memory, and the data stored in the OPB memory may be used when necessary.

Incidentally, in the high-speed imaging mode, signal charges that are prevented from being transferred to the horizontal CCD 15 by the potential barriers of the control gate sections 16 are caused to flood the vertical CCDs 13. In this state, signal charges of one line are mixed with those of other lines. However, this causes no problems because those charges are not used. Signal charges flooding the vertical CCDs 13 flow backward to the sensor sections 11 in the next signal reading operation, and flow out to, for instance, an overflow drain of the substrate.

In this embodiment, signal charges that are prevented from being transferred to the horizontal CCD 15 by the potentials of the control gate sections 16 are caused to flood the vertical CCDs 13 as they are, and then flow backward to the sensor sections 11 in the next signal reading operation so as to be discarded to the overflow drain of the substrate. The embodiment may be so modified that those charges may be overflown to adjacent transfer channels 23 as shown in FIG. 16.

Figure 16:
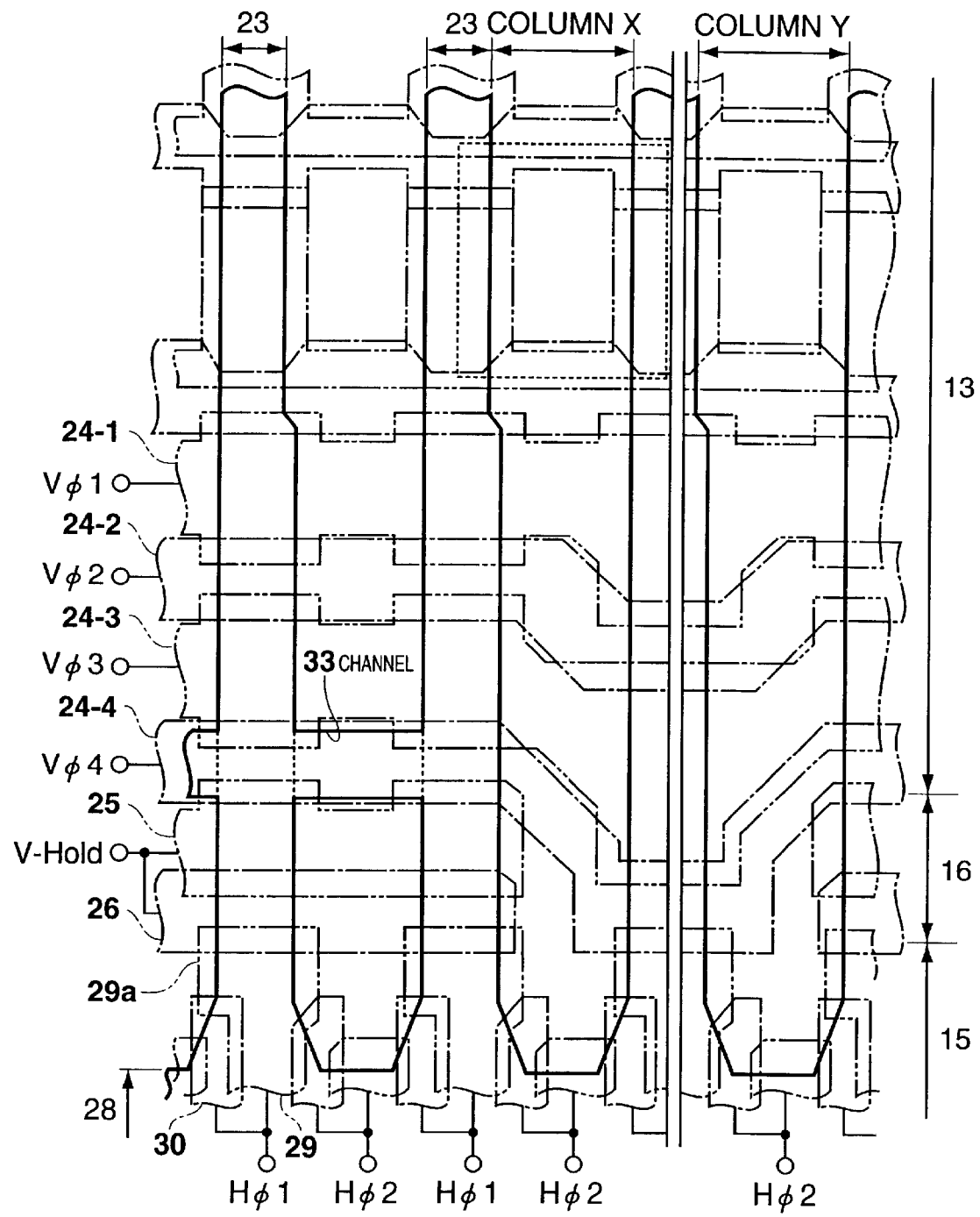
FIG. 16 shows a plan pattern of a modification of the first embodiment.

As shown in FIG. 16, a dedicated channel (charge guide section) 33 which connects the adjacent transfer channels 23 to each other is formed under the fourth-phase electrode 24-4 located adjacent to each control gate section 16 on its imaging area 14 side. Signal charges that are prevented from being transferred by the potential barriers of the control gate sections 16 are caused to flood the transfer channels 23 that have carried the signal charges and are overflown to the adjacent transfer channels 23. The overflow charges are eventually flow backward to the sensor sections 11 and then to the overflow drain of the substrate.

Figure 17:
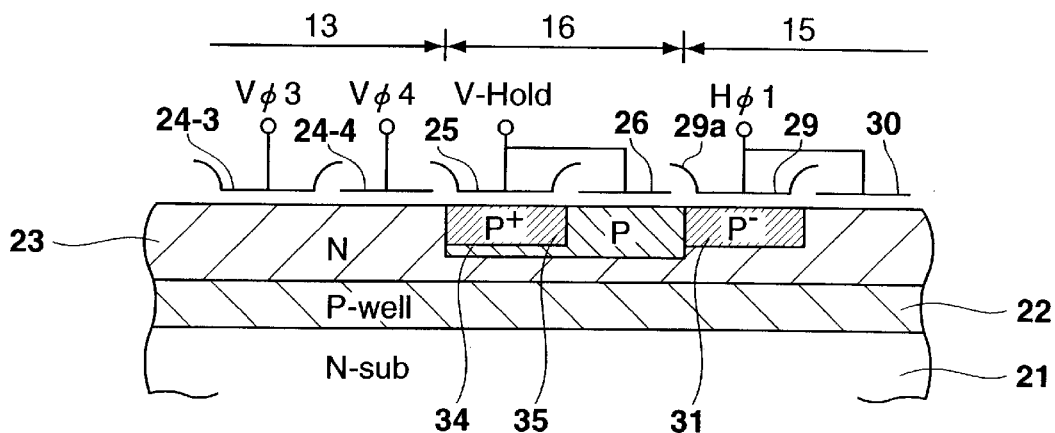
FIG. 17 is a sectional view showing the structure of another example of control gate sections.

FIG. 17 is a sectional view showing another specific structure of peripheral portions of the control gate sections 16. In FIG. 17, the components equivalent to the components in FIG. 4 are given the same reference symbols. In this example, each control gate section 16 is constituted of a second-layer polysilicon transfer electrode 25 (indicated by a two-dot chain line in FIG. 16) and a first-layer polysilicon storage electrode 26 (indicated by a one-dot chain line) which are arranged in order above the transfer channels 23. A control voltage V-Hold is applied to the transfer electrode 25 and the storage electrode 26.

A p-type impurity layer 34 is formed in a surface portion of the transfer channel 23 under the transfer electrode 25 and the storage electrode 26. A $p^+$-type impurity layer 35 is formed in a front surface portion of the p-type impurity layer 34. With this structure, the potentials under the transfer electrode 25 and the storage electrode 26 of each control gate section 16 are made relatively shallow.

Figure 18:
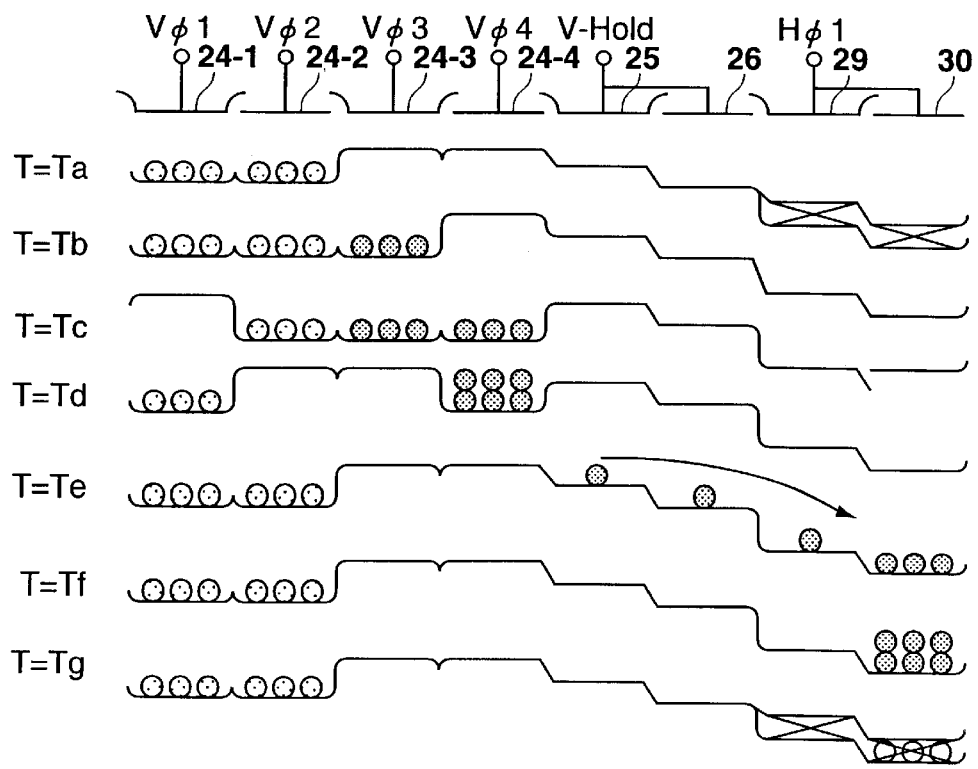
FIG. 18 is a potential diagram of a normal imaging mode in the modification of the first embodiment.

Next, with reference to the timing chart of FIG. 7 and a potential diagram of FIG. 18, a description will be made of an operation in a normal imaging mode of the CCD solid-state imaging apparatus having the control gate sections 16 of the above structure. In this modification, in the normal imaging mode, the control voltage V-Hold is always at the H-level (corresponds to the M-level of the vertical transfer clock signals V$\phi$1–V$\phi$4) as indicated by broken lines in FIG. 7, and hence the potentials under the electrodes 25 and 26 of the control gate sections 16 are always deep. The potential diagram of FIG. 18 shows potential profiles under the electrodes of the vertical CCD 13 and the control gate section 16 at respective time points Ta–Tg shown in FIG. 7.

First, at time Ta which is immediately before the start of a horizontal blanking period during which the horizontal sync signal HD (see FIG. 7) is at the L-level, the vertical transfer clock signals V$\phi$1 and V$\phi$2 are at the M-level (medium level among the 3-value levels). Therefore, the potentials under the first-phase and second-phase transfer electrodes 24-1 and 24-2 are deep and hence signal charges of two pixels vertically adjacent to each other that have been read out from the sensor sections 11 are stored there. At this time point, since the vertical transfer clock signals V$\phi$3 and V$\phi$4 are at the L-level, the potentials under the third-phase and fourth-phase transfer electrodes 24-3 and 24-4 are shallow.

Subsequently, at time Tb in the horizontal blanking period, the vertical transfer clock V$\phi$3 is changed to the M-level and hence the potential under the third-phase transfer electrode 24-3 becomes deep. Therefore, part of the signal charges stored under the first-phase and second-phase transfer electrodes 24-1 and 24-2 move to the position under the third-phase transfer electrode 24-3.

At time Tc, since the vertical transfer clock signal V$\phi$1 is changed to the L-level and the vertical transfer clock signal V$\phi$4 is changed to the M-level, the potential under the first-phase transfer electrode 24-1 becomes shallow and the potential under the transfer electrode 24-4 becomes deep. Therefore, the signal charges stored under the first-phase to third-phase transfer electrodes 24-1 to 24-3 move to the positions under the second-phase to fourth-phase transfer electrodes 24-2 to 24-4.

At time Td, since the vertical transfer clock signals V$\phi$1 and V$\phi$4 are at the M-level and the vertical transfer clock signals V$\phi$2 and V$\phi$3 are at the L-level, the potentials under the first-phase and fourth-phase transfer electrodes 24-1 and 24-4 are deep and the potentials under the second-phase and third-phase transfer electrodes 24-2 and 24-3 are shallow. At this time point, since the potentials under the electrodes 25 and 26 of the control gate section 16 are shallower than the potential under the fourth-phase transfer electrode 24-4, the signal charges stored under the second-phase and third-phase transfer electrodes 24-2 and 24-3 come to be stored under the fourth-phase transfer electrode 24-4.

At time Te, since the vertical transfer clock signal V$\phi$2 is changed to the M-level and the vertical transfer clock signal V$\phi$4 is changed to the L-level, the potential under the second-phase transfer electrode 24-2 becomes deep and the potential under the fourth-phase transfer electrode 24-4 becomes shallow. Therefore, the signal charges stored under the fourth-phase transfer electrode 24-4 move to the horizontal CCD 15 via the control gate section 16. Then, the time elapses past Tf to Tg. At time Tg, horizontal transfer is effected in the horizontal CCD 15.

Figure 19:
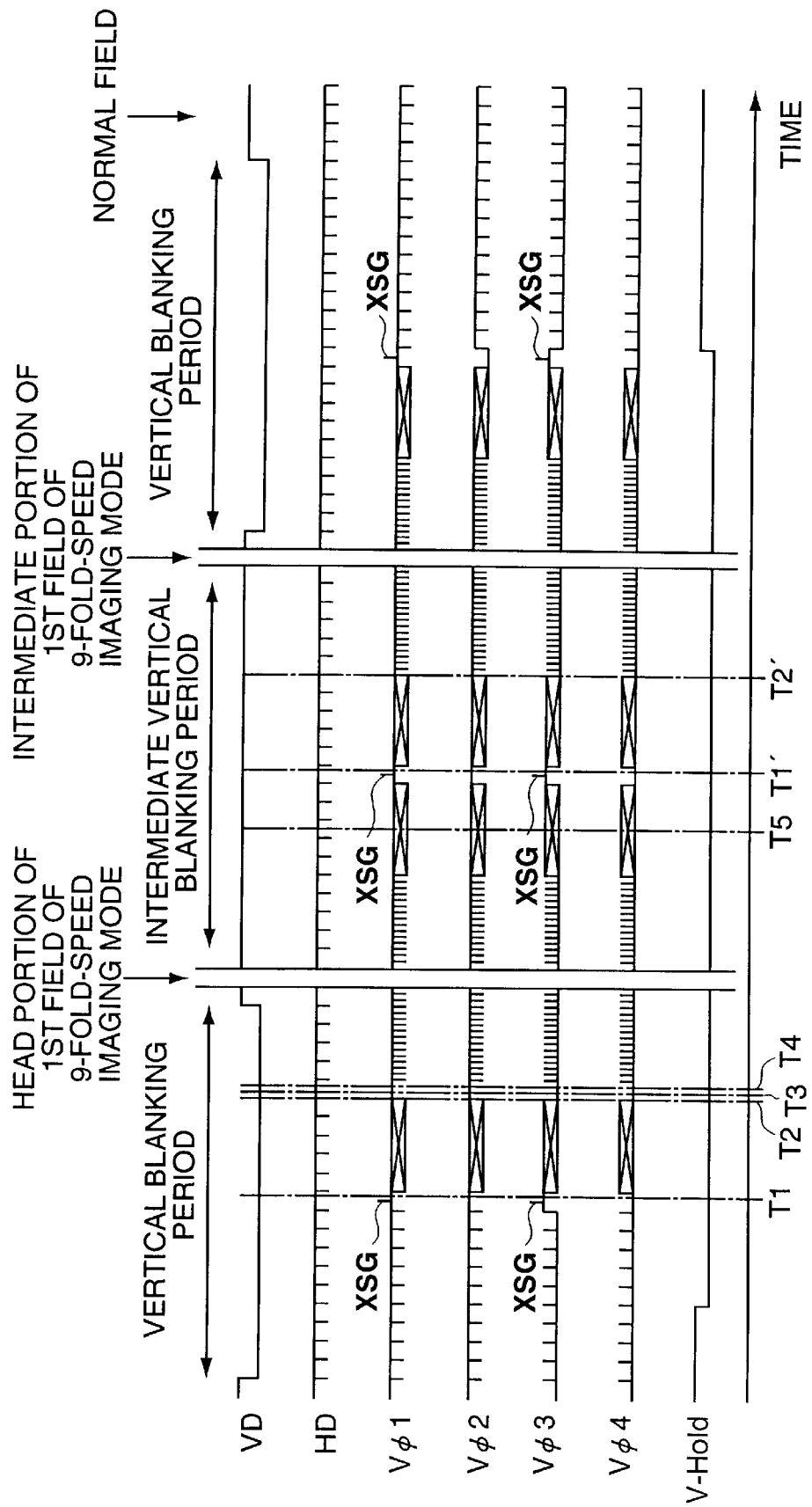
FIG. 19 is a timing chart of a 9-fold-imaging mode in the modification of the first embodiment.

In this modification, since the potentials under the transfer electrode 25 and the storage electrode 26 of each control gate section 16 are made shallow in advance, in the normal imaging mode the control voltage V-Hold need not be changed to the H-level each time a line shift is effected in the horizontal blanking period, that is, the control voltage V-Hold may always be set at the H-level. Therefore, the configuration of a timing generation circuit (not shown) for generating the control voltage V-Hold can be simplified as well as the power consumption can be reduced. FIG. 19 is a timing chart of a 9-fold-speed imaging mode in this modification, which only the control voltage V-Hold has a waveform different from that shown in FIG. 9.

Although in the first embodiment the control gate sections 16 have the two-layer electrode structure consisting of the transfer electrode 25 and the storage electrode 26 so as to conform to the four-phase driving/two-layer electrode structure of the vertical CCDs 13, the invention is not limited to such a case. For example, if the vertical CCDs 13 have a three-phase driving/three-layer electrode structure, the control gate sections 16 may have a single-layer electrode structure.

Figure 20:
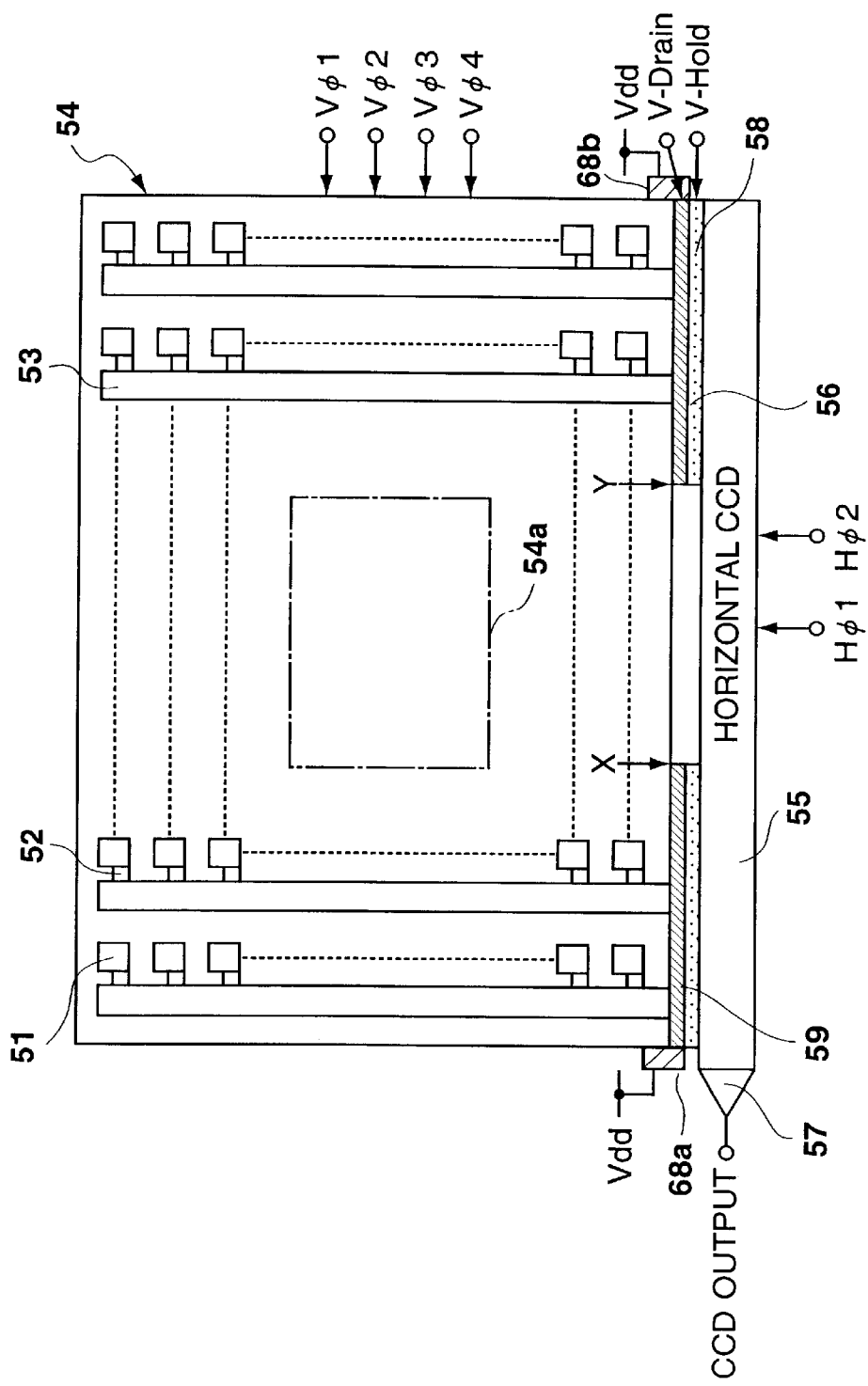
FIG. 20 shows a general configuration of a second embodiment of the invention.

FIG. 20 shows a general configuration of a second embodiment in which the invention is applied to an interline transfer type CCD solid state imaging device, for instance. As shown in FIG. 20, an imaging area 54 is constituted of a plurality of sensor sections 51 and a plurality of vertical CCDs 53. Arranged in the row (horizontal) and column (vertical) directions, i.e., in matrix form, the sensor sections 51 convert incident light into signal charges of amounts corresponding to light quantities of the incident light, and accumulate the signal charges thus produced. Provided for each vertical column of the sensor sections 51, each vertical CCD 53 vertically transfers signal charges read out from the sensor sections 51 by respective read gate sections 52.

In the imaging area 54, each sensor section 51 is a pn-junction photodiode, for instance. A signal charge accumulated in each sensor section 51 is read out to the associated vertical CCD 53 when a read pulse XSG (described later) is applied to the associated read gate section 52. The vertical CCDs 53 are transfer-driven by 4-phase vertical transfer clock signals $V\phi1$–$V\phi4$, for instance, and sequentially transfer portions of read-out signal charges in the vertical direction such that each portion corresponding to one scanning line (one line) is transferred in a portion of each horizontal blanking period.

In the vertical CCDs 53, first-phase and third-phase transfer electrodes also serve as gate electrodes of the read gate sections 52. Therefore, among the 4-phase vertical transfer clock signals $V\phi1$–$V\phi4$, the first-phase transfer clock signal $V\phi1$ and the third-phase transfer clock signal $V\phi3$ are set to have three values: a L-level, a M-level, and a H-level. A pulse of the third-value level, i.e., the H-level, serves as a read pulse XSG for the read gate sections 52.

A horizontal CCD 55 is disposed under the imaging area 54 (as viewed in FIG. 20). Signal charges are sequentially transferred from the plurality of vertical CCDs 53 to the horizontal CCD 55 such that signal charges corresponding to one line are transferred each time. Transfer-driven by 2-phase horizontal transfer clock signals $H\phi1$ and $H\phi2$, for instance, the horizontal CCD 55 sequentially transfers, in the horizontal direction, signal charges transferred from the vertical CCDs 53 such that signal charges of one line are transferred in a horizontal scanning period after the preceding horizontal blanking period.

Control gate sections (transfer control section) 56, which are provided between the vertical CCDs 53 and the horizontal CCD 55, are constituted of transfer prohibiting sections 58 for selectively prohibiting transfer of signal charges from the vertical CCDs 53 to the horizontal CCD 55 and charge ejecting portions 58 for ejecting charges whose transfer has been prohibited by the transfer prohibiting sections 58. To prohibit transfer of signal charges from the vertical CCDs 53 to the horizontal CCD 55 selectively, i.e., in certain regions in the horizontal direction, both end regions in this example, the control gate sections 56 are provided to occupy both end regions in the horizontal direction in the imaging area 54.

In a normal imaging mode, the control gate sections 56 transfer, as they are, all of signal charges supplied from the vertical CCDs 53 line by line to the horizontal CCD 55. On the other hand, in a high-speed imaging mode, among signal charges supplied from the vertical CCDs 53 line by line, the control gate sections 56 transfer signal charges only in the central region to the horizontal CCD 55 while prohibiting signal charges in both end regions in the horizontal direction from being transferred to the horizontal CCD 55 by means of the transfer prohibiting sections 58 and ejecting at least charges overflown from transfer channels by means of the charge ejecting sections 59. A specific configuration of the control gate sections 56 will be described later in detail.

A charge-to-voltage conversion section 57 having a configuration of a floating diffusion amplifier, for instance, is provided at a transfer destination end of the horizontal CCD 55. The charge-to-voltage conversion section 57 sequentially converts signal charges that are horizontally transferred by the horizontal CCD 55 into a voltage signal and outputs it. The voltage signal is output as a CCD output signal which corresponds to the amount of incident light coming from an object.

Figure 21:
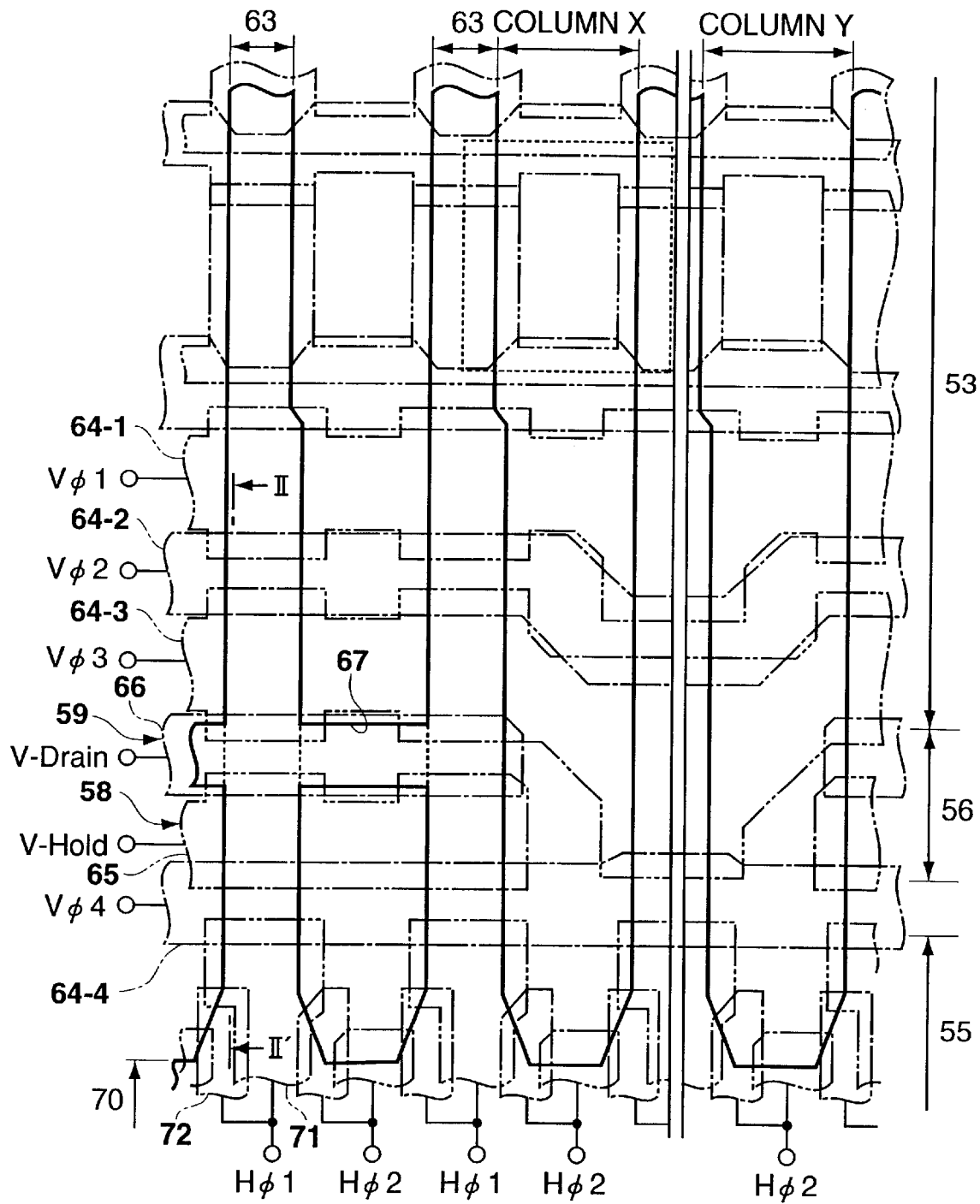
FIG. 21 shows a plan pattern of control gate sections of the second embodiment.
Figure 22:
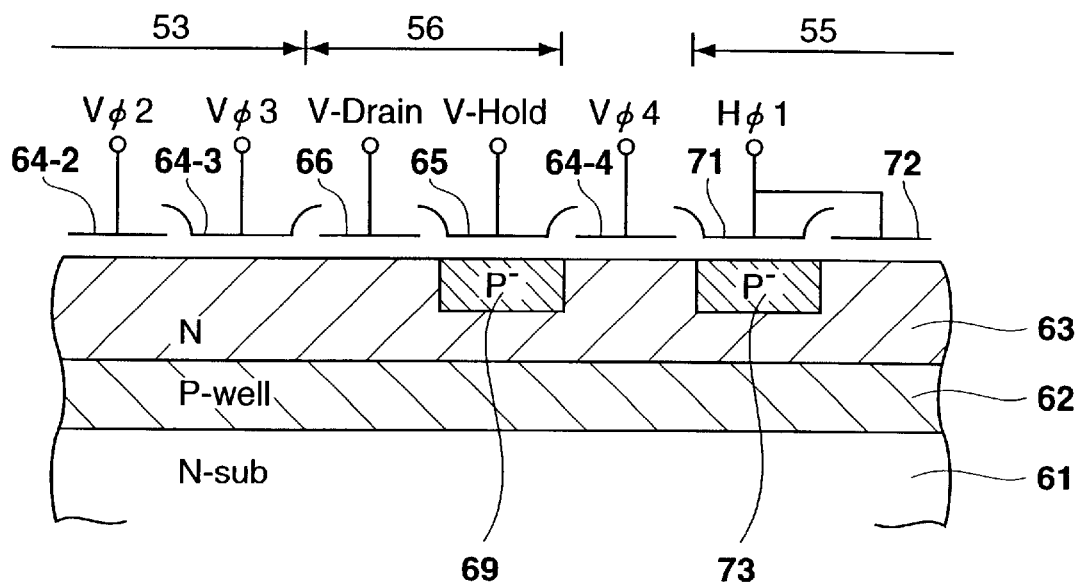
FIG. 22 is a sectional view taken along line II–II' and viewed from the side of arrows in FIG. 21.

FIG. 21 is a plan pattern diagram showing a specific configuration of peripheral portions of the control gate sections 56, and FIG. 22 is a sectional view taken along line II–II' and viewed from the side of arrows in FIG. 21. In FIG. 21, column X corresponds to a vertical column X at the boundary of the left-hand control gate section 56 shown in FIG. 20 and column Y corresponds to a vertical column Y at the boundary of the right-hand control gate section 56. A configuration between columns X and Y is omitted.

Each vertical CCD 53 is constituted of a transfer channel 63 of an n-type impurity which is formed on an n-type substrate 61 through a p-type well 62, and 4-phase transfer electrodes 64-1 to 64-4 that are arranged above the transfer channel 63 so as to be repeated in the transfer direction of the transfer channel 63. The transfer electrodes 64-1 and 64-4 have a 2-layer electrode structure in which the second-phase transfer electrode 64-2 and the fourth-phase transfer electrode 64-4 are formed as first-layer polysilicon electrodes (indicated by one-dot chain lines in FIG. 22) and the first-phase transfer electrode 64-1 and the third-phase transfer electrode 64-3 are formed as second-layer polysilicon electrodes (indicated by two-dot chain lines in FIG. 22).

Each control gate section 56 is constituted of the transfer prohibiting section 58 and the charge ejecting section 59 as described above, and disposed between the third-phase transfer electrodes 64-3 and the fourth-phase transfer electrodes 64-4 of the final transfer stage of the vertical CCDs 53. Each transfer prohibiting section 58 is constituted of a second-layer polysilicon gate electrode 65 (indicated by a two-dot chain line in FIG. 21) disposed above the transfer channels 63. Further, a $p^-$-type impurity layer 69 is formed in a surface portion of the transfer channel 63 under the gate electrode 65.

On the other hand, each charge ejecting section 59 is constituted of a first-layer polysilicon drain electrode 66 (indicated by a one-dot chain line in FIG. 21) disposed above the transfer channels 63, overflow channels (charge guide sections) 67 provided so as to bridge the adjacent transfer channels 63 to guide charges overflown from the transfer channels 63 in the lateral direction, and drain sections 68a and 68b (see FIG. 20) for sweeping the charges guided by the overflow channels 67. For example, a power supply voltage Vdd is applied to the drain sections 68a and 68b.

The horizontal CCD 55 is constituted of a transfer channel 70 of an n-type impurity and electrode pairs of a transfer electrode 71 and a storage electrode 72 that are arranged above the transfer channel 70 so as to be repeated in the transfer direction of the transfer channel 70. The electrodes 29 and 30 have a two-layer electrode structure in which the storage electrode 72 is formed as a first-layer polysilicon electrode (indicated by a one-dot chain line in FIG. 21) and the transfer electrode 71 is formed as a second-layer polysilicon electrode (indicated by a two-dot chain line in FIG.

21). A p⁻-type impurity layer 73 is formed in a surface portion of the transfer channel 70 under the transfer electrode 71. Horizontal transfer clock signals H$\phi$1 and H$\phi$2 are alternately applied to the electrode pairs which are arranged repeatedly.

As seen from FIG. 20, the above-configured control gate sections 56 occupy both right-hand and left-hand portions of the imaging area 54 excluding a central portion 54a. In a normal imaging mode, a control voltage V-Hold applied to the gate electrodes 65 and a drain voltage V-Drain applied to the drain electrode 66 become a H-level (corresponds to the M-level of the vertical transfer clock signals V$\phi$1–V$\phi$4) and a L-level according to predetermined timing that is shown by solid lines in a timing chart of FIG. 23, whereby the control gate sections 56 performs a transfer operation in the same manner as the vertical CCDs 53. Thus, signal charges are transferred as they are from the vertical CCDs 53 to the horizontal CCD 55.

Figure 23:
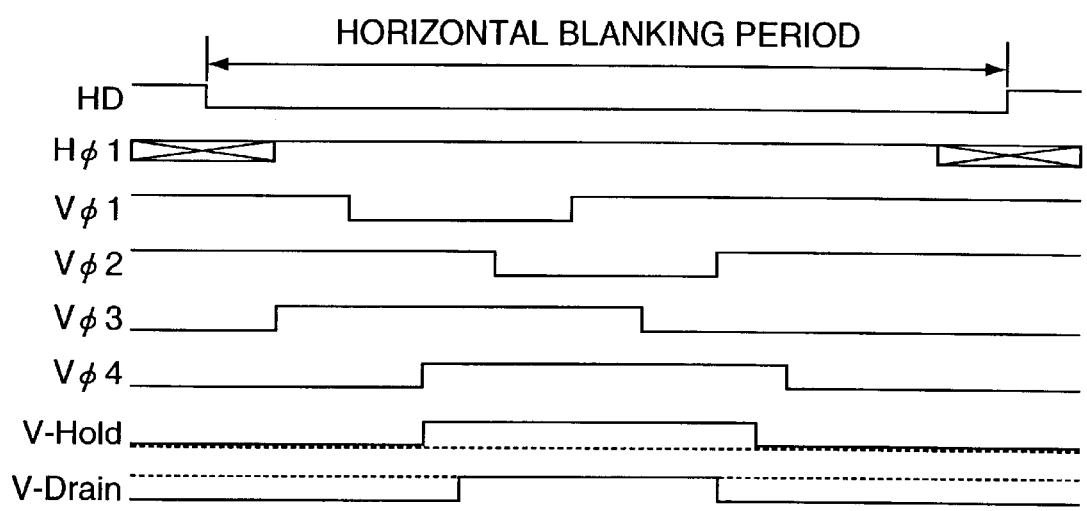
FIG. 23 is a timing chart showing the operation of the second embodiment.

On the other hand, in a high-speed imaging mode, the control voltage V-Hold is always set at the L-level as indicated by a broken line in the timing chart of FIG. 23. As a result, the potentials under the gate electrodes become shallow, whereby signal charges are prohibited from being transferred from the vertical CCDs 53 to the horizontal CCD 55. In this case, since the drain voltage V-Drain is always set at the H-level (equal to or higher than the M-level of the vertical transfer clock signals V$\phi$1–V$\phi$4), the potential under the drain electrodes 66 becomes approximately equal to or deeper than the deeper level of the potential of the transfer channels 63.

With the above configuration, charges stopped by the potential barriers under the gate electrodes 65 are accumulated under the drain electrodes 66. Part of the accumulated charges that are overflown from the transfer channels 63 are guided in the lateral directions by the overflow channels 67 to the drain sections 68a and 68b and swept into the drain sections 68a and 68b. As a result, signal charges only in a central portion 54a of the imaging area 54 can be read out.

As described above, the control gate sections (transfer control section) 56 capable of prohibiting signal charges in the selected regions in the horizontal direction of the imaging area 54 from being transferred from the vertical CCDs 53 to the horizontal CCD 55 are constructed such that not only do the transfer prohibiting sections 58 selectively prohibit transfer of signal charges from the vertical CCDs 53 to the horizontal CCD 56 but also the charge ejecting sections 59 discard at least part of the transfer-prevented charges that are overflown from the transfer channels 63. As a result, there is no possibility that part of transfer-prevented charges are overflown from the vertical CCDs 53 and go over the potential barriers of the transfer prohibiting sections 58 to flow into the horizontal CCD 55. Therefore, signal charges in the regions where charge transfer from the vertical CCDs 53 to the horizontal CCD 55 should be prohibited can reliably be prevented from being transferred to the horizontal CCD 55.

Although in the second embodiment the control gate sections 56 are constructed such that charges that are transfer-prevented by the potential barriers of the transfer prohibiting sections 58 are guided to the horizontal ends of the imaging area 54 by the overflow channels 67 bridging the adjacent transfer channels 63 and swept into the drain sections 68a and 68b formed on both sides of the imaging area 54, the configuration of the control gate sections 56 is not limited to the above one.

Figure 24:
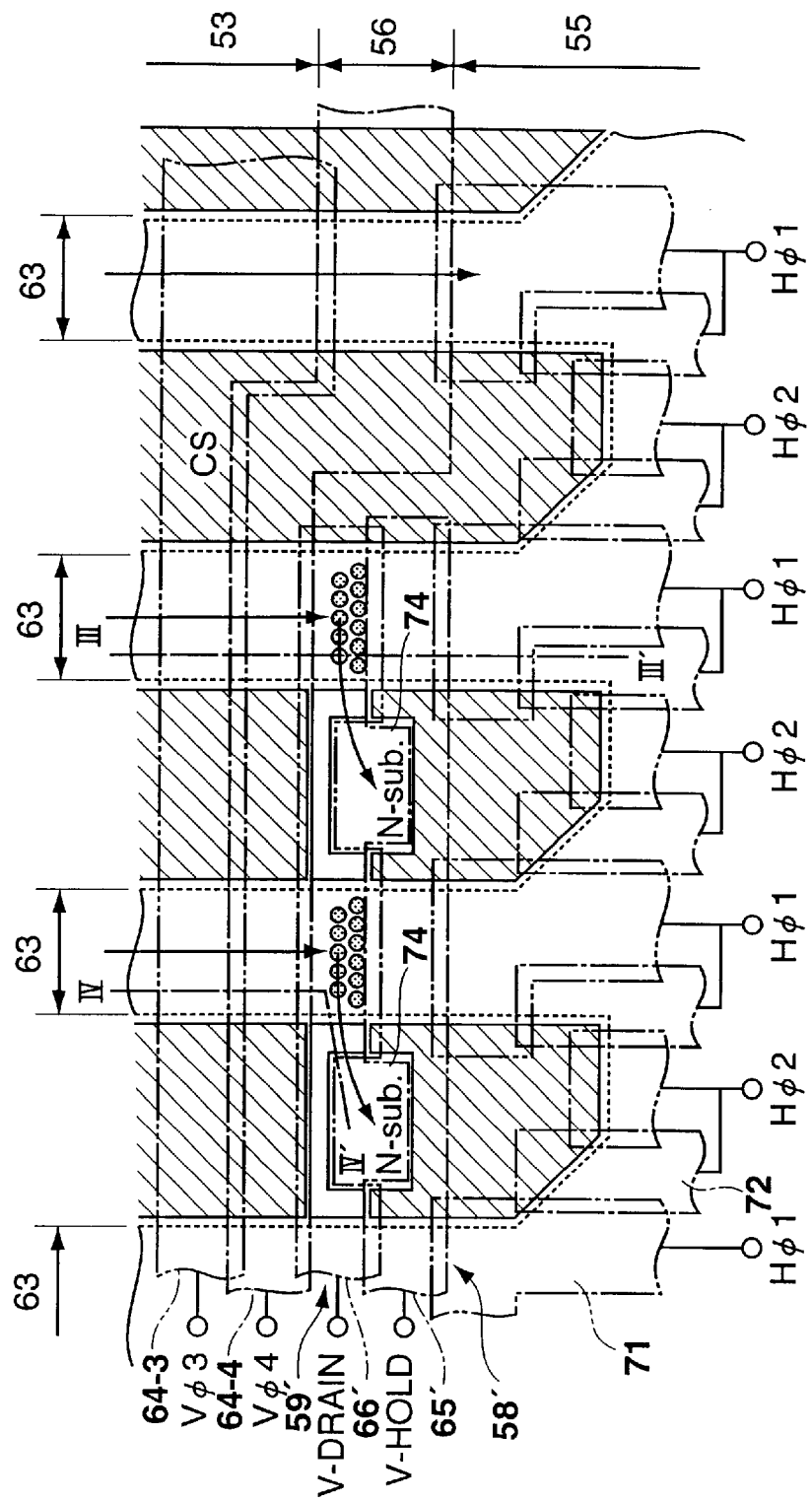
FIG. 24 shows a plan pattern of the main part according to a third embodiment of the invention.

A third embodiment of the invention, which is directed to the control gate sections, will be hereinafter described. FIG. 24 shows a plan pattern of the main part of control gate sections according to the third embodiment, and FIGS. 25A and 25B are sectional views taken along line III–III' and IV–IV' in FIG. 24, respectively. In FIGS. 24 and 25A–25B, the components equivalent to those in FIGS. 21 and 22 are given the same reference symbols.

Like the control gate sections 56 of the second embodiment, each control gate section 56' of the third embodiment is constituted of a transfer prohibiting section 58' and a charge ejecting section 59'. In this embodiment, each control gate section 56 is provided between a fourth-phase transfer electrode 64-4 of the final transfer stage of the vertical CCDs 53 and the horizontal CCD 55. The transfer prohibiting section 58' is constituted of a first-layer polysilicon gate electrode 65' (indicated by a one-dot chain line in FIG. 24) disposed above the transfer channels 63.

On the other hand, the charge ejecting section 59' is constituted of a second-layer polysilicon drain electrode 66' (indicated by a two-dot-chain line in FIG. 24) disposed above the transfer channels 63, overflow channels (charge guide sections) 67' provided so as to bridge the adjacent transfer channels 63 to guide charges overflown from the transfer channels 63 in the lateral direction, and drains 74 formed in the respective overflow channels 67'. In FIG. 24, hatched regions are channel stop (CS) regions.

As seen from FIG. 25B, the drains 74 are constituted of an n-type substrate 61 itself; that is, the n-type substrate 61 is exposed in portions of the overflow channels 67'. Also as seen from FIG. 25B, a p⁺-type impurity layer 75 is formed in a surface portion of each overflow channel 67', so that the potential of the overflow channel 67' is made shallower than that of the transfer channels 63.

Figure 26:
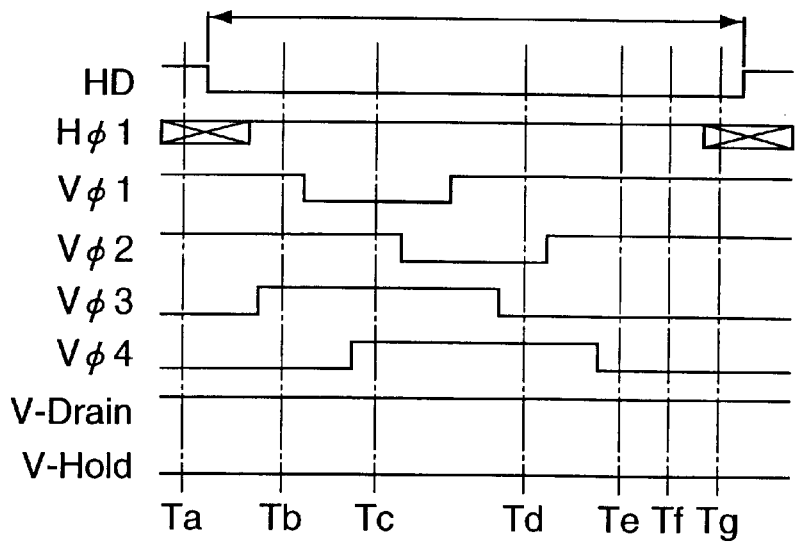
FIG. 26 is a timing chart of a high-speed imaging mode in the third embodiment.
Figure 27:
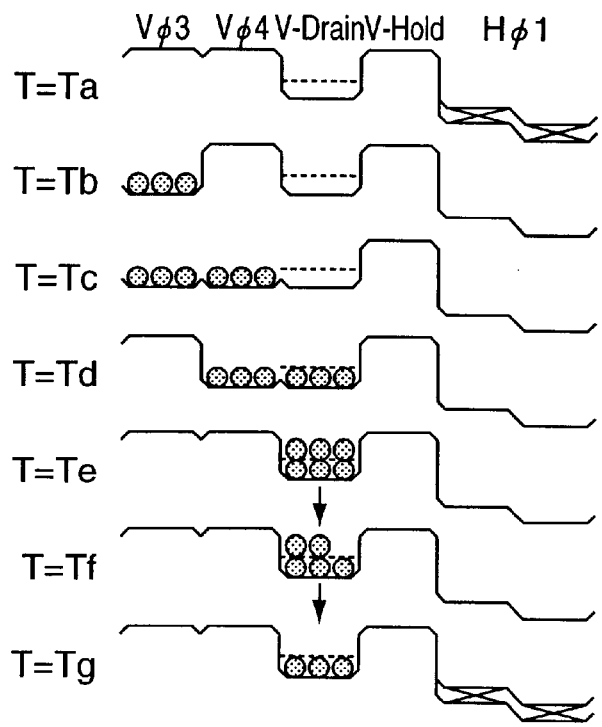
FIG. 27 is a potential diagram of the high-speed imaging mode in the third embodiment.

Next, the operation of the above-configured control gate sections 56' of the third embodiment will be described. First, an operation in a high-speed imaging mode (V-H transfer is prohibited) will be described. FIGS. 26 and 27 are a timing chart and a potential diagram, respectively, of the high-speed imaging mode. During a vertical transfer performed by the vertical CCDs 53 with application of the vertical transfer clock signals V$\phi$1–V$\phi$4, the potentials of the transfer channels 63 under the gate electrodes 65' are made shallow by applying a L-level control voltage V-Hold to the gate electrodes 65'. Resulting potential barriers prevent transfer of signal charges from the vertical CCDs 53 to the horizontal CCD 55.

At this time, a H-level drain voltage V-Drain is applied to the drain electrodes 66', whereby the potentials of the overflow channels 67' are set at a medium level that is deeper than the potential level of the transfer prohibiting sections 58' that is obtained when they are supplied with a L-level voltage and shallower than the potential level of the transfer channels 63 that is obtained when they are supplied with a H-level voltage. As a result, a "supernatant" part of signal charges that are transfer-prevented by the transfer prohibiting sections 58' and excessively accumulated in the transfer channels 63, i.e., signal charges whose potentials are higher than the level indicated by broken lines shown in FIG. 27 are swept into the drains 74, i.e., the substrate 61, via the overflow channels 67'.

In general, a substrate voltage Vsub which is applied to the substrate 61 is made variable to keep the saturation signal charge amount of the sensor sections at a constant level. For example, when a variation occurs in overflow barrier potential due to variations in manufacture or the like in sensor sections of a vertical overflow drain structure, the saturation signal charge amount can be kept constant by controlling the overflow barrier potential through the substrate voltage Vsub.

Where the substrate voltage Vsub is variable as in the case under consideration, the potential of the overflow channels 67' may be set lower than the lower limit of the variable range of substrate voltage Vsub. As a result, even if the substrate voltage Vsub is set at any voltage value to keep the saturation signal charge amount at a constant level, excess charges caused by transfer prohibition can properly be swept into the substrate 61 without being affected by the value of the substrate voltage Vsub.

Figure 28:
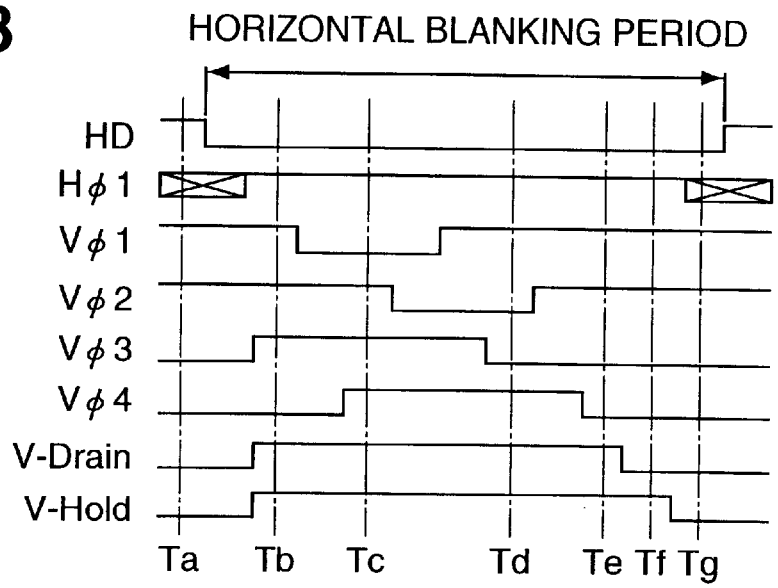
FIG. 28 is a timing chart of a normal imaging mode in the third embodiment.
Figure 29:
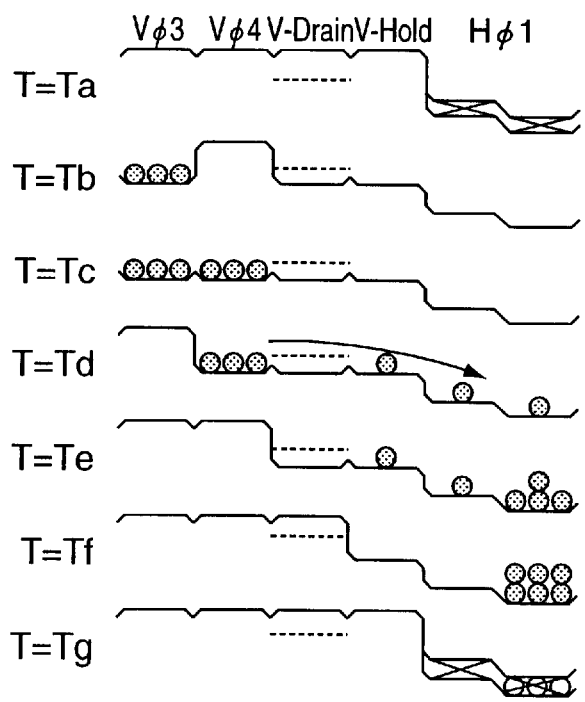
FIG. 29 is a potential diagram of the normal imaging mode in the third embodiment.

Next, an operation in a normal imaging mode (in a normal transfer) will be described. FIGS. 28 and 29 are a timing chart and a potential diagram, respectively, of the normal imaging mode. Upon the start of a transfer with the vertical CCDs 53, a 1-line shift based on the vertical transfer clock signals V$\phi$1–V$\phi$4 is performed with both of the control voltage V-Hold and the drain voltage V-Drain set at the H-level.

After completion of the 1-line shift, the drain voltage V-Drain and the control voltage V-Hold are made the L-level in order. As a result, signal charges vertically transferred through the vertical CCDs 53 are transferred to the horizontal CCD 53 via the transfer prohibiting sections 58'. During this normal transfer, the charge ejecting sections 59' perform only transfer and does not perform storage. Therefore, there does not occur an event that signal charges pass through the overflow channels 67' whose potential is shallower than the potential of the transfer channels 63 and are discarded to the substrate 61.

As described above, in the control gate sections (transfer control section) 56' capable of prohibiting signal charges in the selected regions in the horizontal direction of the imaging area 54 from being transferred from the vertical CCDs 53 to the horizontal CCD 55, the charge ejecting sections 59' for ejecting signal charges whose transfer is prevented by the transfer prohibiting sections 58' has the drain structure in which those signal charges are directly swept into the substrate 61 (i.e., the drains 74) via the overflow channels 67'. This provides the following advantages.

Since the ejection destinations (drains 74) of excess charges resulting from transfer prevention are provided very close to the transfer channels 63, the excess charges can be ejected reliably irrespective of the horizontal position of the transfer channels 63 even in the case of a CCD solid-state imaging device having a large imaging area 54. Therefore, signal charges in the regions where transfer from the vertical CCDs 53 to the horizontal CCD 55 should be prohibited can be prevented reliably from being transferred. Further, necessary processing is to merely expose the substrate 61 in the area of a fine V-H pattern, the processing can be performed easily.

Figure 30:
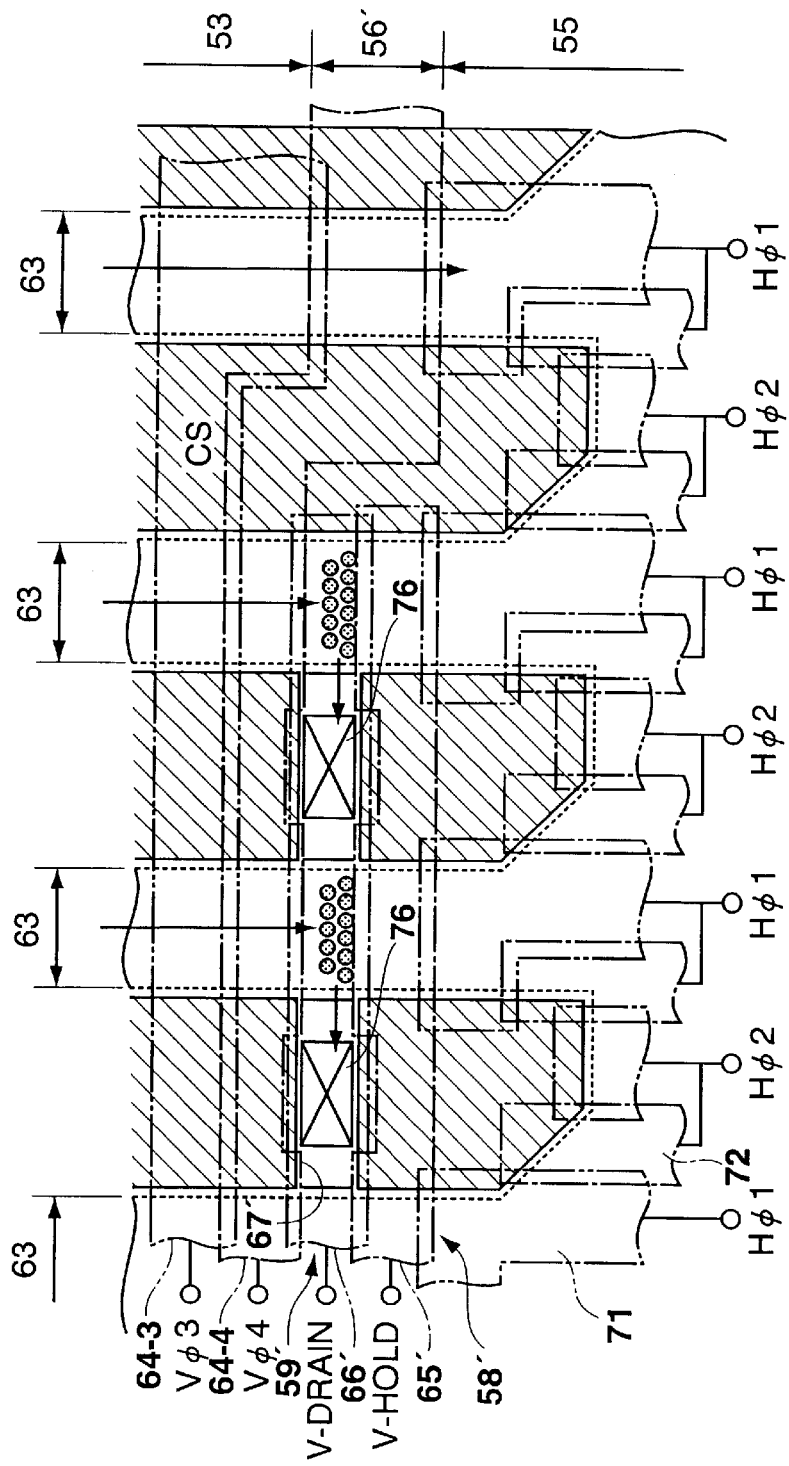
FIG. 30 shows a plan pattern of the main part according to a modification of the third embodiment of the invention.

In the third embodiment, the charge ejecting sections 59' are so constructed that the drains 74 are formed by exposing the substrate 61 in the overflow channels 67' and excess charges resulting from transfer prevention are directly swept into the substrate 61. Alternatively, as shown in FIG. 30, a drain structure may be employed in which n-type contact sections 76 are formed in the overflow channels 67' bridging the adjacent transfer channels 63 and are connected to a power supply or the n-type back substrate 61. The transfer-prevented charges are swept into the power supply or the substrate 61 via the contact portions 76 which are formed right beside the transfer channels 63.

In the third embodiment, the control gate sections 56' are provided between the fourth-phase transfer electrodes 64-4 of the final transfer stage of the vertical CCDs 53 and the horizontal CCD 55. Alternatively, as in the case of the second embodiment, the control gate sections 56' may be provided between the third-phase transfer electrodes 64-3 and the fourth-phase transfer electrodes 64-4 of the final transfer stage of the vertical CCDs 53, to provide similar advantages.

Although the above-described first to third embodiments are directed to the case where the invention is applied to an IT (interline transfer) type CCD solid-state imaging device, the invention is not limited to such a case and can also be applied in similar manners to FT (frame transfer) type and FIT (frame interline transfer) type CCD solid-state imaging devices which have a storage area for temporarily storing signal charges of the respective pixels in addition to an imaging area. In these cases, the control gate sections (transfer control section) capable of prohibiting a V-H transfer selectively, i.e., in given regions in the horizontal direction of the imaging area may provided either between the imaging area and the storage area or between the storage area and the horizontal CCD.

Figure 31:
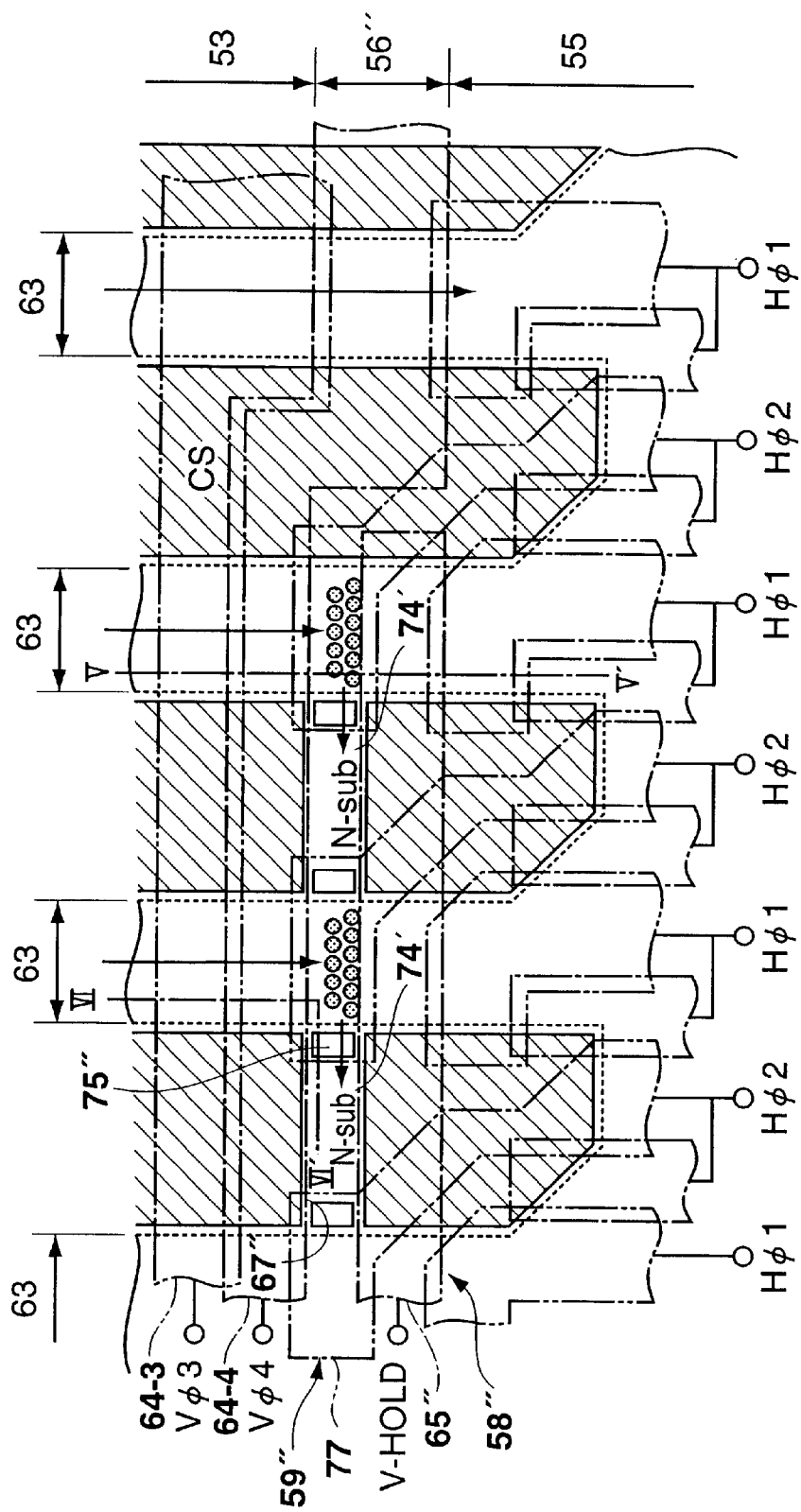
FIG. 31 shows a plan pattern of the main part according to a fourth embodiment of the invention.
Figure 32A:
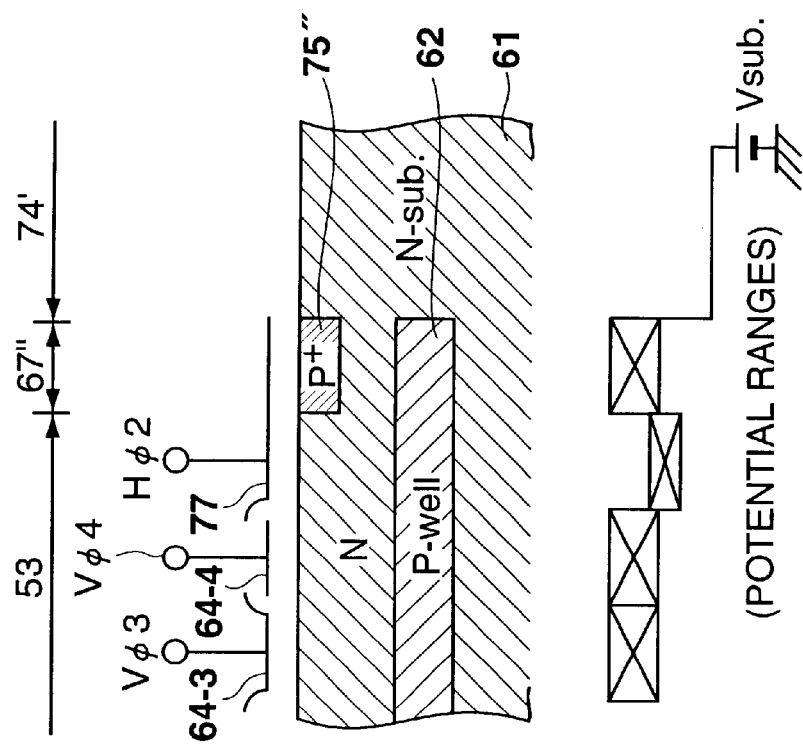
FIGS. 32A and 32B are sectional views of the main part of the fourth embodiment taken along lines V–V' and VI–VI' in FIG. 31, respectively.
Figure 32B:
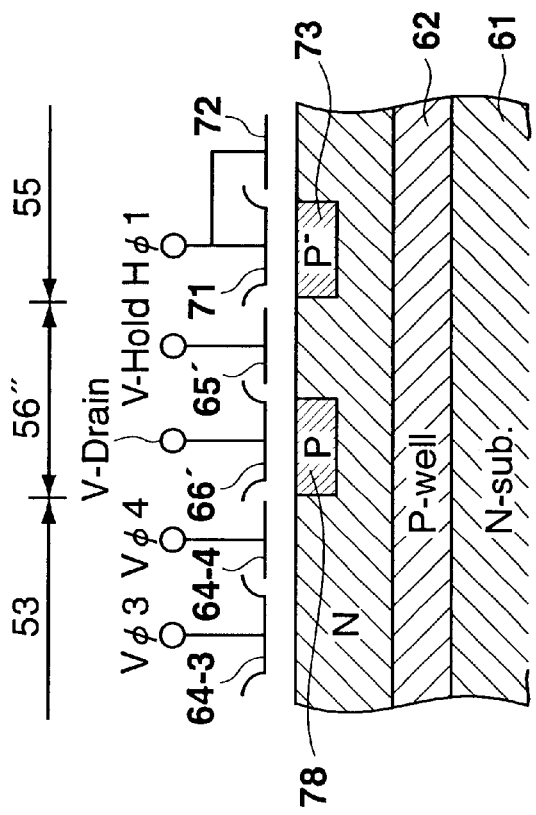

FIG. 31 shows a plan pattern of the main part of control gate sections according to a fourth embodiment of the invention, and FIGS. 32A and 32B are sectional views taken along lines V–V' and VI–VI' in FIG. 31. In FIGS. 31 and 32A–32B, the components equivalent to those in FIGS. 24 and 25A–25B are given the same reference symbols.

Like the control gate sections 56 of the second embodiment, each control gate section 56" according to the fourth embodiment is constituted of a transfer prohibiting section 58" provided between the fourth-phase transfer electrode 64-4 of the final transfer stage of the vertical CCDs 53 and the horizontal CCD 55 and a charge ejecting section 59". While the transfer prohibiting section 58" is constituted of a first-layer silicon gate electrode 65" (indicated by a one-dot chain line in FIG. 31) disposed above the transfer channels 63, drain electrodes 77 of the charge ejecting section 59" are formed as second-layer polysilicon electrodes (indicated by two-dot chain lines in FIG. 31) that serve as electrodes of transfer sections for H$\phi$2 of the horizontal CCD 55.

That is, the drain electrodes 77 are formed such that in the horizontal CCD 55, of the electrodes to which a second-phase horizontal transfer clock signal H$\phi$2 is applied, the second-layer polysilicon electrodes of the transfer sections are so patterned as to extend past the first-layer polysilicon gate electrode 65" of the transfer prohibiting section 58. With this configuration, the dedicated drain electrode 66' that is used in the third embodiment is not necessary.

Usually, the horizontal transfer clock signals H$\phi$1 and H$\phi$2 are in a range of 0 to 3 V and the vertical transfer clock signals V$\phi$1–V$\phi$4 are in a range of –7 to 0 V. During a transfer from the vertical CCDs 53 to the horizontal CCD 55 (a V-H transfer), the horizontal transfer clock signals H$\phi$1 and H$\phi$2 are set at the H-level and the L-level, respectively.

Therefore, by forming the drain electrodes 77 as the second-layer polysilicon electrodes for H$\phi$2, basically electric fields for transfer from vertical CCDs 53 to the horizontal CCD 55 can be obtained in the transfer direction only by a voltage difference between the horizontal transfer clock signals H$\phi$1 and H$\phi$2 even without performing any processing on the transfer channels 63 under the drain electrodes 77 such as impurity implantation.

The drain structure of the charge ejecting sections 59" is the same as in the third embodiment. That is, in the charge ejecting sections 59", drains 74' are formed such that the substrate 61 is exposed in overflow channels 67" which bridge the adjacent transfer channels 63 to cause charges that are overflown from the transfer channels 63 to flow in the lateral direction. As seen from FIG. 32B, p$^+$-type impurity layers 75" are formed in surface, inlet portions of each overflow channel 67", whereby the potential of the overflow channels 67" is made shallower than that of the transfer channels 63.

In this embodiment, to produce electric fields for transfer from the vertical CCDs 53 to the horizontal CCD 55 in the transfer direction more reliably, p-type impurity layers 78 whose impurity concentration is equivalent to or higher than that of the transfer sections of the horizontal CCD 55 are formed in the transfer channels 63 under the drain electrodes 77 by ion implantation.

Figure 33:
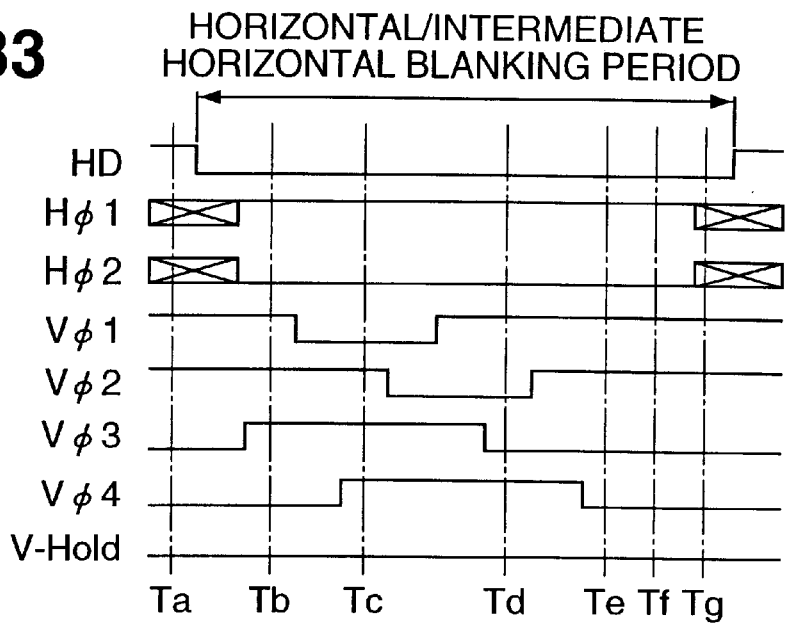
FIG. 33 is a timing chart of a high-speed imaging mode in the fourth embodiment.
Figure 34:
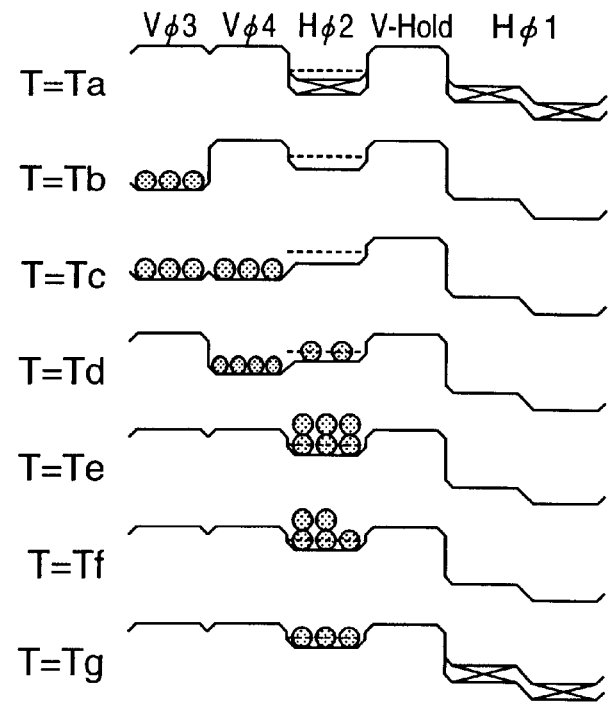
FIG. 34 is a potential diagram of the high-speed imaging mode in the fourth embodiment.

Next, the operation of the above-configured control gate sections 56" of the fourth embodiment will be described. First, an operation in a high-speed imaging mode (V-H transfer is prohibited) will be described. FIGS. 33 and 34 are a timing chart and a potential diagram, respectively, of the high-speed imaging mode. During a vertical transfer performed by the vertical CCDs 53 with application of the vertical transfer clock signals V$\phi$1–V$\phi$4, the potentials of the transfer channels 63 under the gate electrodes 65" are made shallow by applying a L-level control voltage V-Hold to the gate electrodes 65". Resulting potential barriers prevent transfer of signal charges from the vertical CCDs 53 to the horizontal CCD 55.

At this time, the second-phase horizontal clock signal H$\phi$2 for driving the drain electrodes 77 is at the L-level. Transfer-prevented signal charges are accumulated under the drain electrodes 77, and a "supernatant" part of excess charges accumulated in the transfer channels 63, i.e., signal charges whose potentials are higher than the level indicated by broken lines shown in FIG. 34 are swept into the drains 74', i.e., the substrate 61, via the overflow channels 67".

Figure 35:
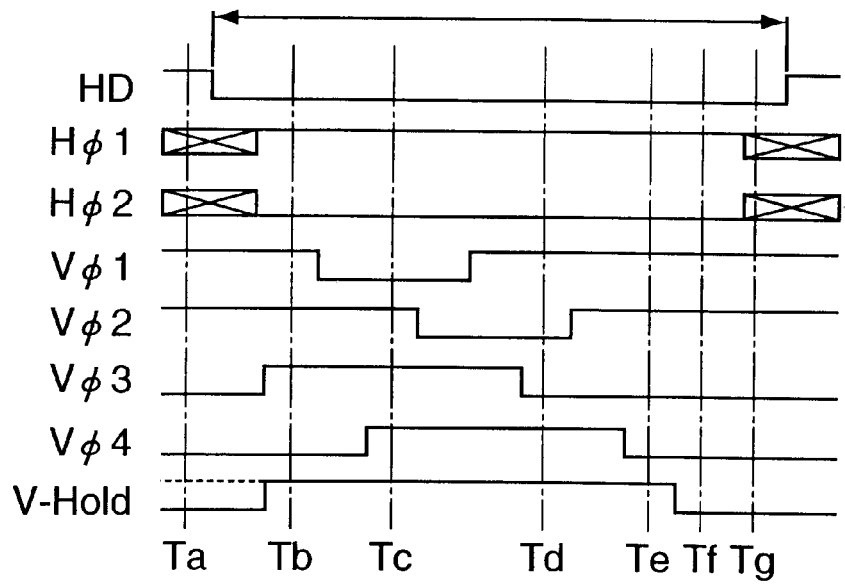
FIG. 35 is a timing chart of a normal imaging mode of the fourth embodiment.
Figure 36:
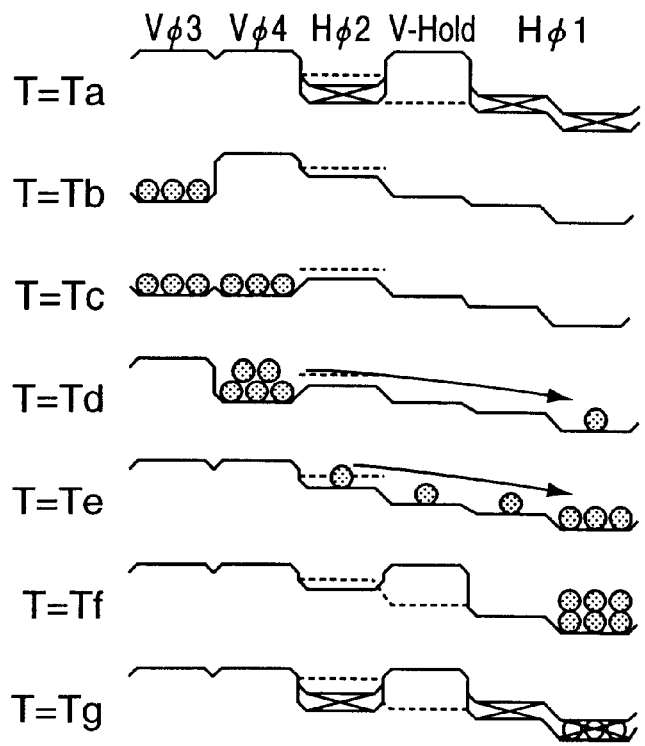
FIG. 36 is a potential diagram of the normal imaging mode in the fourth embodiment.

Next, an operation in a normal imaging mode (in a normal transfer) will be described. FIGS. 35 and 36 are a timing chart and a potential diagram, respectively, of the normal imaging mode. Upon the start of a transfer with the vertical CCDs 53, a 1-line shift based on the vertical transfer clock signals V$\phi$1–V$\phi$4 is performed with the control voltage V-Hold set at the H-level. In this 1-line shift period, an ordinary V-H transfer is effected because the second-phase horizontal transfer clock signal H$\phi$2 for driving the drain electrodes 77 is at the L-level and hence electric fields for transfer from the vertical CCDs 53 to the horizontal CCD 55 are formed in the transfer direction. The control voltage V-Hold may always be at the H-level. If the control voltage V-Hold is always at the H-level, a clock driver can be omitted by establishing a GND level outside or inside, which means a reduction in the number of terminals.

As described above, in this embodiment, in the control gate sections 56", the gate electrodes 77 of the charge ejecting sections 59" are formed as the second-layer polysilicon electrodes of the transfer sections of the horizontal CCD 55 and driven by the second-phase horizontal transfer clock signal H$\phi$2. As a result, a clock signal dedicated to driving of the gate electrodes 77 can be omitted and hence one pin (terminal) for input of that clock signal can be eliminated.

Further, since the drain electrodes 77 are formed as the second-layer polysilicon electrodes of the transfer sections for H$\phi$2 of the horizontal CCD 55 and the first-phase and second-phase horizontal transfer clock signals H$\phi$1 and H$\phi$2 become the H-level and the L-level, respectively, in a V-H transfer, basically electric fields for transfer from vertical CCDs 53 to the horizontal CCD 55 can be obtained in the transfer direction only by a voltage difference between the horizontal transfer clock signals H$\phi$1 and H$\phi$2 even without performing any processing on the transfer channels 63 under the drain electrodes 77 such as impurity implantation.

In the above-described fourth embodiment, excess charges resulting from transfer prevention are swept into the drains 74' formed between the adjacent transfer channels 63 as in the case of the third embodiment. Alternatively, as in the case of the second embodiment (see FIGS. 20 and 21), excess charges may be guided to the horizontal ends of the imaging area 54 by the overflow channels 67 bridging the adjacent transfer channels 63 so as to be swept into the drains 68a and 68b which are formed on both sides of the imaging area 54. This modification will be described below.

Figure 37:
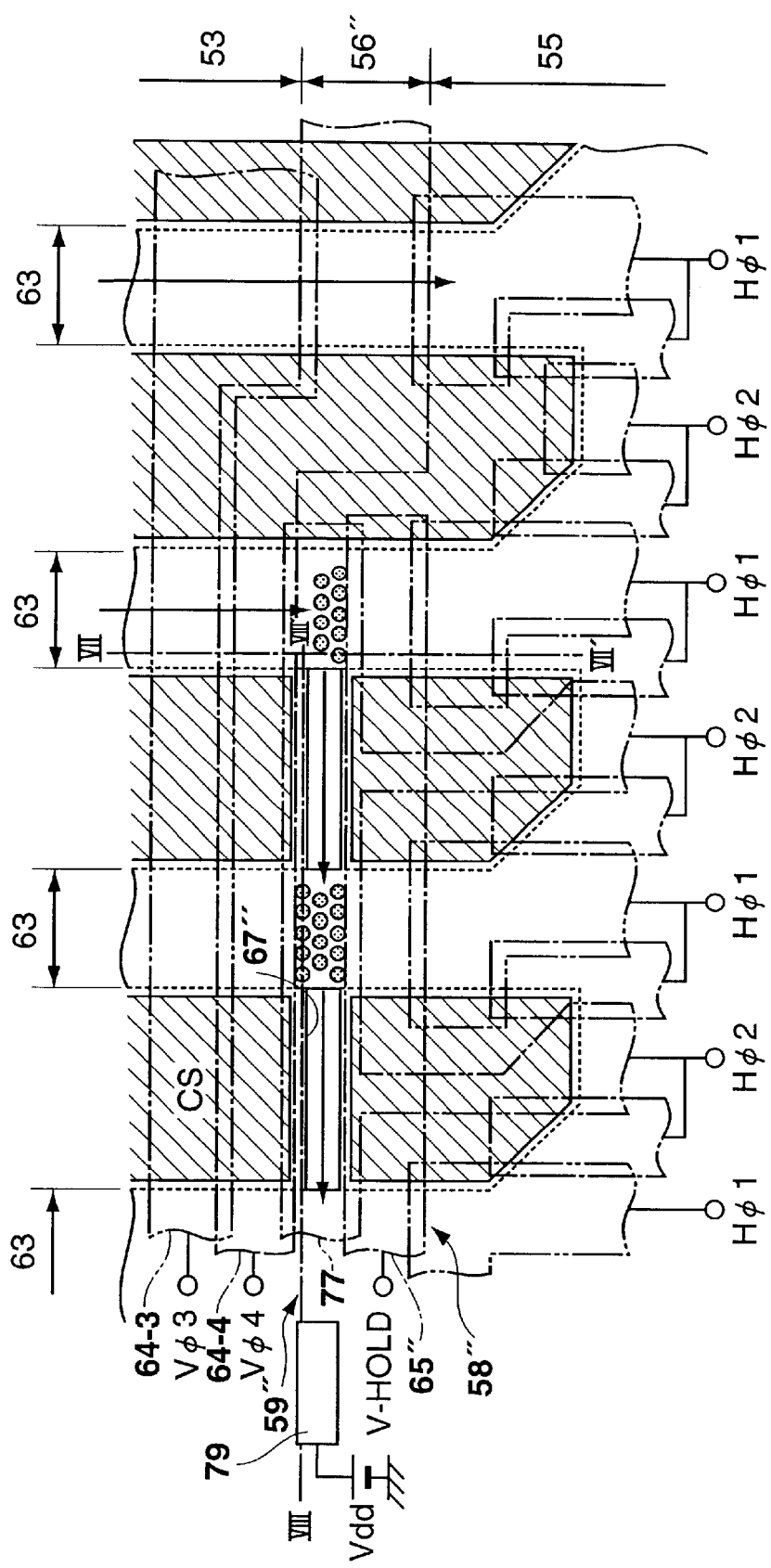
FIG. 37 shows a plan pattern of the main part according to a modification of the fourth embodiment of the invention.

FIG. 37 shows a plan pattern of the main part according to the modification of the fourth embodiment, and FIGS. 38A and 38B are sectional views taken along lines VII–VII' and VIII–VIII' in FIG. 37, respectively. In FIGS. 37 and 38A–38B, the components equivalent to those in FIGS. 31 and 32A–32B are given the same reference symbols.

In charge ejecting sections 59" of this modification, drain electrodes 77 are formed along overflow channels 67" as second-layer polysilicon electrodes (indicated by two-dot chain lines in FIG. 37) of the transfer sections for H$\phi$2 of the horizontal CCD 55, and n$^+$ impurity layers as drains 79 are formed outside the imaging area. Excess charges resulting from transfer prevention are guided by the overflow channels 67" and swept into the drains 79, which are supplied with a power supply voltage Vdd, for instance.

Figure 39:
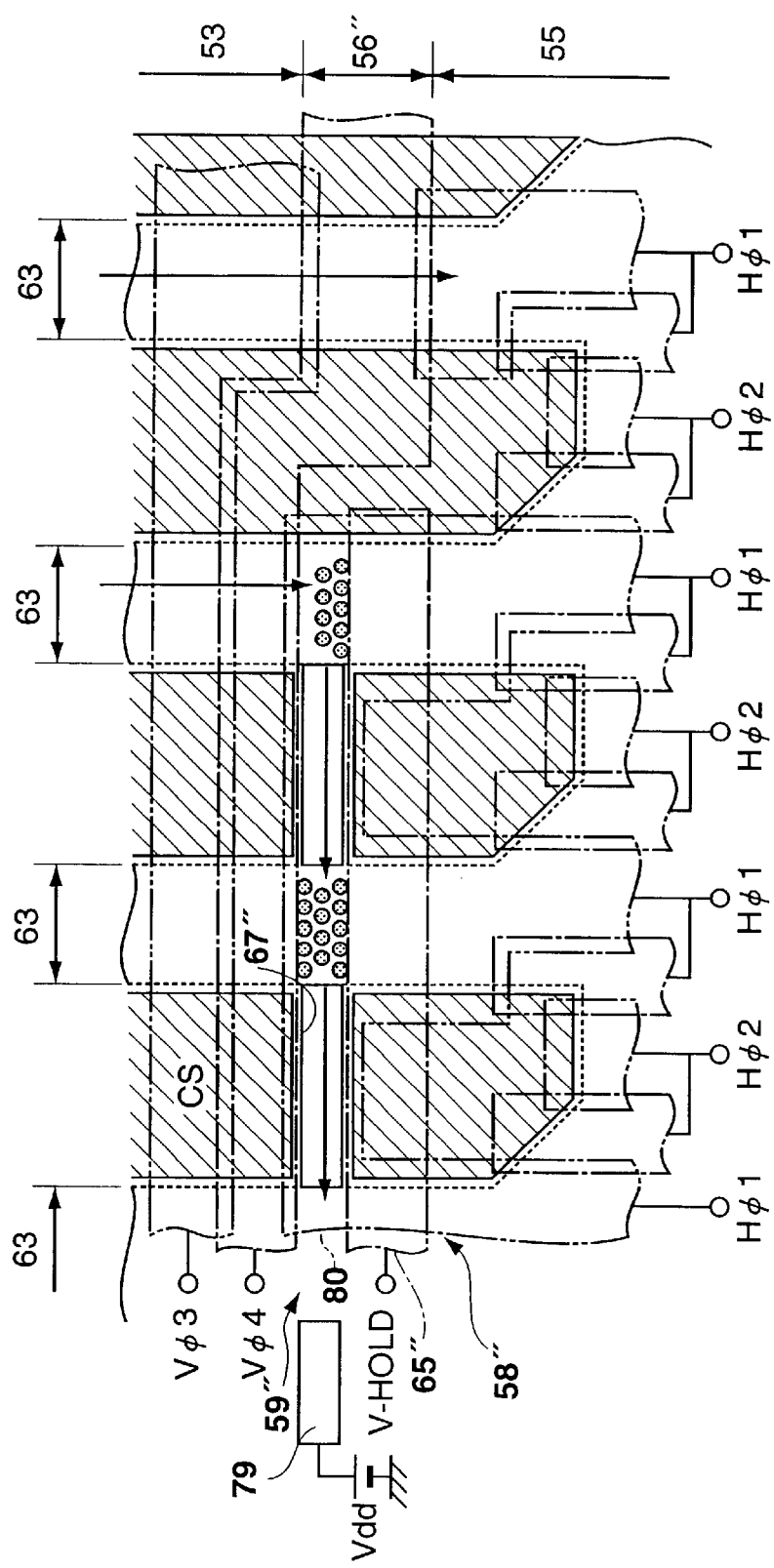
FIG. 39 shows a plan pattern of the main part of another modification of the fourth embodiment of the invention.

Although in the fourth embodiment and its modification the drain electrodes 77 of the charge ejecting sections 59" are formed as the second-layer polysilicon electrodes of the transfer sections for H$\phi$2 of the horizontal CCD 55, they may be formed as second-layer polysilicon electrodes of the transfer sections for H$\phi$1 of the horizontal CCD 55 as shown in FIG. 39. That is, in the horizontal CCD 55, drain electrodes 80 are constructed such that the second-layer polysilicon electrodes to which the first-phase horizontal transfer clock signal H$\phi$1 is applied are so patterned as to extend past the first-layer polysilicon gate electrodes 65" of the transfer prohibiting sections 58".

In this case, the first-phase horizontal transfer clock signal H$\phi$1 turns to the H-level during a vertical transfer. Therefore, to make the potential of the portions of the transfer channels 63 under the drain electrodes 80 shallow, the p-type impurity concentration under the drain electrodes 80 is set higher than in the case where the drain electrodes 77 are formed as the second-layer polysilicon electrodes of the transfer sections for H$\phi$2. With this measure, the vertical transfer operation can be performed properly.

As seen from a comparison between FIGS. 39 and 37, in the case where the drain electrodes 80 of the charge ejecting sections 59" are formed as the second-layer polysilicon electrodes of the transfer sections for H$\phi$1 of the horizontal CCD 55, the drain electrodes 80 can be patterned wider than in the case where the drain electrodes 80 are formed as second-layer polysilicon electrodes of the transfer sections for H$\phi$2. This is advantageous in terms of patterning of the drain electrodes 80.

Like the example of FIG. 37, the example of FIG. 39 is directed to the case where excess charges resulting from transfer prevention are swept into the drains 79 outside the imaging area via the overflow channels 67". It is apparent that the configuration of FIG. 39 can also be applied to the case where excess charges are swept into the drains 74 (or the drains 76) which are formed between the adjacent transfer channels 63, as in the case of the fourth embodiment.

In the above-described embodiments, the operations in the high-speed imaging mode are such that part of 1-line signal charges are merely prevented by the control gate sections 16 from being transferred to the horizontal CCD 15 (first embodiment), or transfer of part of 1-line signal charges is prevented by the transfer prohibiting sections 58 of the control gate sections 56 and excess charges resulting from the transfer prevention are swept away via the charge ejecting sections 59, 59', or 59" (second to fourth embodiments). As a further alternative, signal charges to be transfer-prevented may merely be swept away.

For example, a consideration will be made of the configuration of FIGS. 2 and 3. In the high-speed imaging mode, while in the first embodiment a L-level control voltage V-Hold is applied to the transfer electrodes 25 and the storage electrodes 26 of the control gate sections 16, a high voltage may be applied to those electrodes. As a result, in the high-speed imaging mode, the potentials under the transfer electrodes 25 and the storage electrodes 26 of the control gate sections 16 become deeper than the deeper level of the potential of the transfer channels 23, to form large "grooves". Signal charges to be transfer-prevented fall into these grooves.

Drain sections may be provided on both sides of the imaging area as in the case of the second embodiment, and the charges that have fallen into the grooves may be guided to the drain sections and swept there. Alternatively, as in the case of the third embodiment, drain sections may be formed between the adjacent transfer channels the charges that have fallen into the grooves may be swept directly into the substrate, or the charges may be swept into a power supply or an n-type substrate via n-type contact sections.

In the above configuration, each control gate section to which a high voltage is applied in the high-speed imaging mode has the two-layer electrode structure consisting of the transfer electrode and the storage electrode because the vertical CCDs have a 4-phase driving/2-layer electrode structure. If the vertical CCDs have a 3-phase driving/3-layer electrode structure, each control gate section should have a single-layer electrode structure. Further, as in the case of the second embodiment, each control gate section may be provided between the third-phase and fourth-phase transfer electrodes of the final transfer stage of the vertical CCDs.

Figure 40:
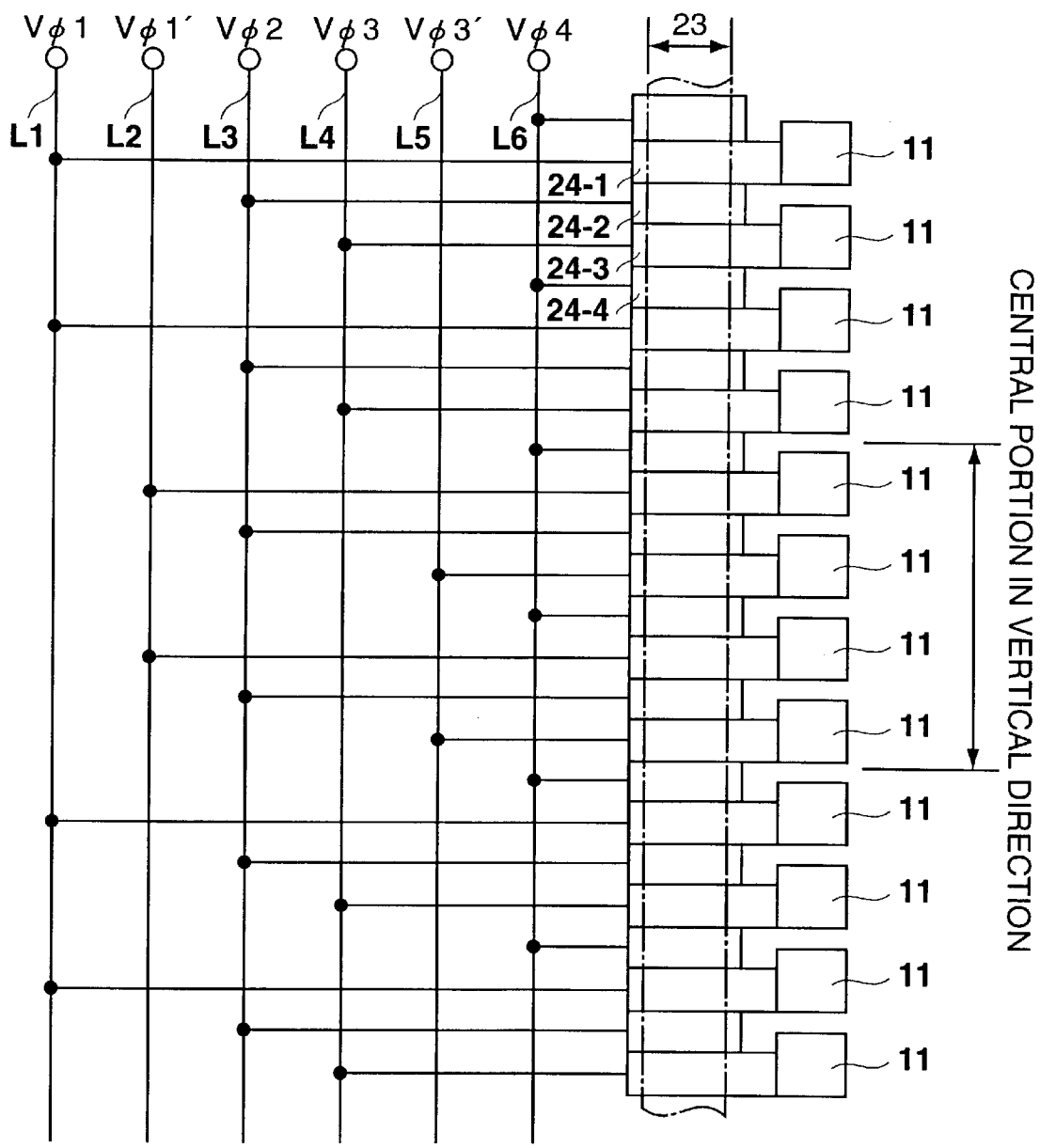
FIG. 40 shows a wiring pattern according to a fifth embodiment of the invention.

FIG. 40 shows a wiring pattern of an example of vertical CCDs according to a fifth embodiment of the invention. In the above-described embodiments, in the high-speed imaging mode, even signal charges of the lines other than the lines whose signal charges are to be transferred to the horizontal CCD are read out from the sensor sections to the vertical CCDs, then vertically transferred at high speed, and finally swept away. In contrast, in this embodiment, for the lines other than the lines whose signal charges are to be transferred to the horizontal CCD, signal charges are not read out from the sensor sections to the vertical CCDs.

A specific configuration of this embodiment will be hereinafter described in a case where the intended concept is applied to the CCD solid-state imaging device shown in FIGS. 2 and 3. To simplify the description, FIG. 40 shows a case where signal charges can always be read out only in a central region of four pixels in the vertical direction and in a high-speed imaging mode signal charges are not read out in regions of four pixels each above and below the central region.

In this wiring system, to enable signal charges to be read out in a particular region in the vertical direction in the high-speed imaging mode, novel wiring for a first-phase vertical transfer clock signal V$\phi$1 and a third-phase vertical transfer clock signal V$\phi$3 has been devised. Specifically, two systems of vertical transfer clock signals V$\phi$1/V$\phi$1' and V$\phi$3/V$\phi$3' are prepared as the first-phase and third-phase vertical transfer clock signals, respectively, and six bus lines L1–L6 are wired to transmit the vertical transfer clock signals.

First-phase transfer electrodes 24-1 of regions other than a central region that is a subject of reading in a high-speed imaging mode are connected, every other pixel, to the bus line L1 for transmitting the vertical transfer clock signal V$\phi$1. First-phase transfer electrodes 24-1 of the central region as the subject of reading in the high-speed imaging mode are connected, every other pixel, to the bus line L2 for transmitting the vertical transfer clock signal V$\phi$1'. Second-phase transfer electrodes 24-2 are connected, every other pixel, to the bus line L3 for transmitting the vertical transfer clock signal V$\phi$2.

Third-phase transfer electrodes 24-3 of the regions other than the central region as the subject of reading in the high-speed imaging mode are connected, every other pixel, to the bus line L4 for transmitting the vertical transfer clock signal V$\phi$3. Third-phase transfer electrodes 24-3 of the central region as the subject of reading in the high-speed imaging mode are connected, every other pixel, to the bus line L5 for transmitting the vertical transfer clock signal V$\phi$3'. Fourth-phase transfer electrodes 24-4 are connected, every other pixel, to the bus line L6 for transmitting the vertical transfer clock signal V$\phi$4.

In the above configuration, the vertical transfer clock signals V$\phi$1, V$\phi$1', V$\phi$2, V$\phi$3, V$\phi$3', and V$\phi$4 are supplied in the normal imaging mode. As a result, signal charges are read out from all the sensor sections 11 to the vertical CCD 13 via the read gate sections 12. On the other hand, the vertical transfer clock signals V$\phi$1', V$\phi$2, V$\phi$3', and V$\phi$4 are supplied in the high-speed imaging mode. As a result, read pulses XSG are applied to only the read gate sections 12 for the sensor sections in the central region in the vertical direction; read pulses XSG are not applied to the read gate sections 12 for the other sensor sections 11. Therefore, signal charges are read out only from the four sensor sections 11 in the central region to the vertical CCD 13.

A further description will be made of an operation in a case of n=1 (see FIG. 5), i.e., a 9-fold-speed imaging mode. Signal charges only in the central region of the imaging area 14 occupying ⅓ of the overall vertical length are read out to the vertical CCDs 13 by supplying the vertical transfer clock signals V$\phi$1', V$\phi$2, V$\phi$3', and V$\phi$4 in a vertical blanking period. Then, a frame shift operation is performed to shift the read-out signal charges the region of the imaging area 14 occupying ⅓ of the vertical overall length.

Immediately after completion of the frame shift, the vertical transfer clock signals V$\phi$1', V$\phi$2, V$\phi$3', and V$\phi$4 are supplied to read out signal charges of the next field from the sensor sections 11 in the central ⅓ region to the vertical CCDs 13. Then, a line shift operation is performed in the last horizontal blanking period of a vertical blanking period so that signal charges of the first line among the signal charges that were first read out in the central region occupying ⅓ of the overall vertical length are read out from the vertical CCDs 13 to the horizontal CCD 15.

At this time, as described above, signal charges in both end regions of the imaging area 14 in the horizontal direction are prevented by the control gate sections 16 from being transferred from the vertical CCDs 13 to the horizontal CCD 15. As a result, among the signal charges of one line, signal charges only in the central region occupying ⅓ of the overall horizontal length are transferred from the vertical CCDs 13 to the horizontal CCD 15.

Subsequently, the signal charges transferred to the horizontal CCD 15 are horizontally transferred to the positions under (as viewed in FIG. 2) in the first half of an effective horizontal period. The above line shift and horizontal transfer are performed for all of the first read-out lines of the central region occupying ⅓ of the overall vertical length in intermediate horizontal blanking periods and effective horizontal periods. As a result, the second read-out signal charges are shifted to the lower ⅓ region of the imaging area 14.

Thereafter, signal charges of the next field in the sensor sections 11 in the central region occupying ⅓ of the overall vertical length are read out to the vertical CCDs 13 by supplying the vertical transfer clock signals $V\phi1'$, $V\phi2$, $V\phi3'$, and $V\phi4$ in a vertical blanking period that is provided between effective vertical periods. Then, signal charges of the first line among the signal charges that were read out second in the central region occupying ⅓ of the overall vertical length are read out from the vertical CCDs 13 to the horizontal CCD 15 in a horizontal blanking period. The above series of operations is repeated thereafter.

As described above, by reading signal charges only in the partial region in the vertical direction in the high-speed imaging mode, immediately after completion of a frame shift signal charges of the next field can be read out without the need for vertically transferring signal charges at high speed and sweeping those in a vertical blanking period. Further, a line shift can be performed immediately after signal charges that have been transferred to the horizontal CCD 15 by a line shift are horizontal transferred to the positions under the control gate section 16. Therefore, there occurs no time loss due to high-speed vertical transfer, contributing to realization of high-speed imaging.

Although in this embodiment the intended concept is applied to the CCD solid-state imaging device of the first embodiment shown in FIG. 2, it can also be applied in similar manners to the CCD solid-state imaging device of the second embodiment shown in FIG. 20 and its modification. Further the application of the basic technical concept of reading out signal charges only in a partial region in the vertical direction (selective reading) is not limited to the above CCD solid-state imaging devices capable of high-speed imaging. That is, signal charges only in an arbitrary region in the vertical direction may be read out selectively without imposing any limitations on how to read signal charges in the imaging area 14 in the horizontal direction.

Figure 41:
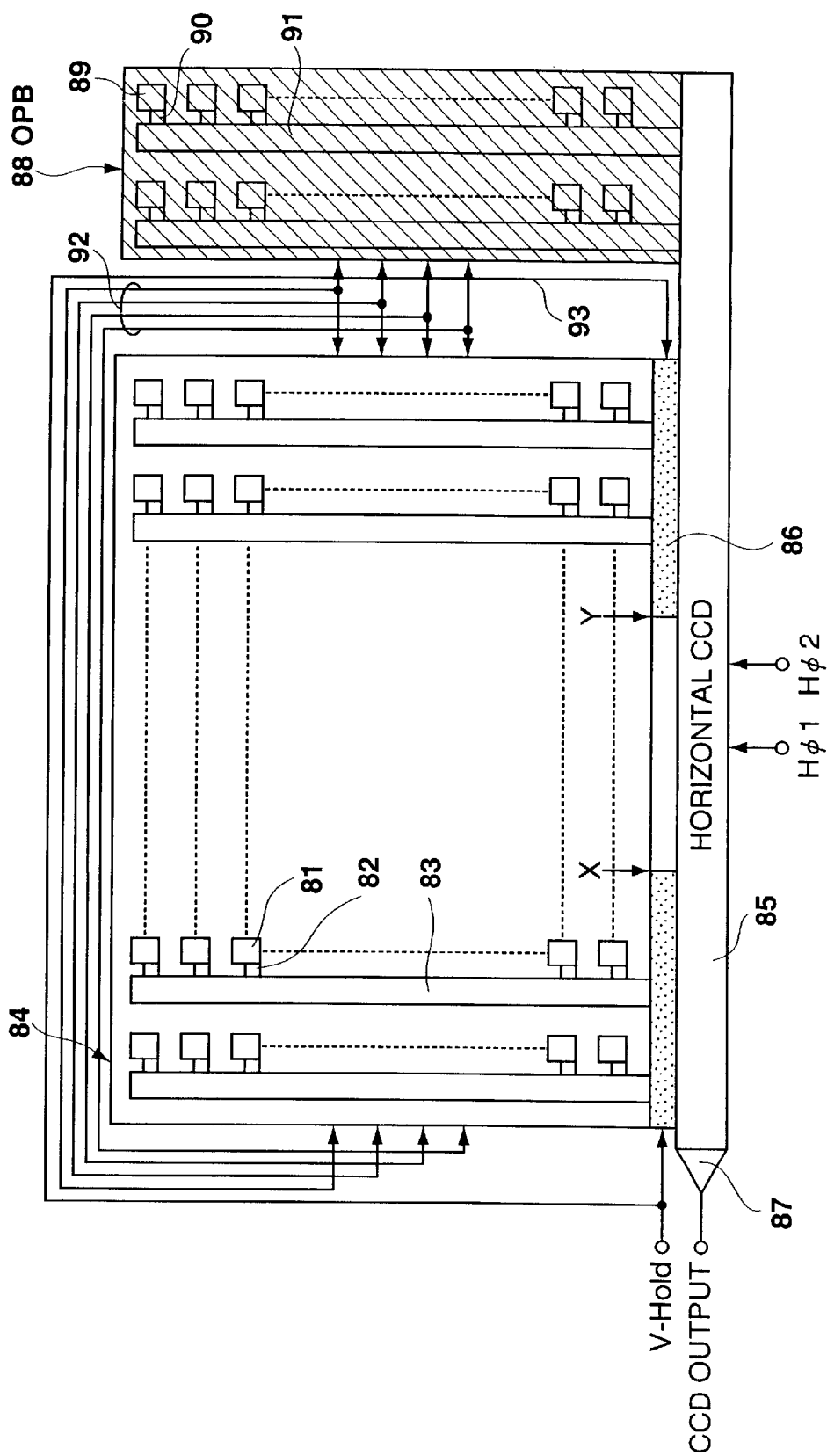
FIG. 41 shows a general configuration of a sixth embodiment of the invention.

FIG. 41 shows a general configuration of a sixth embodiment of the invention. While the above-described embodiments do not mention any configuration of the OPB (optical black area). This embodiment is featured by a configuration of the OPB. The OPB is an area for providing a signal of each line with a black level as its reference level to determine the absolute level of image signals.

As shown in FIG. 41, an imaging area 84 is constituted of a plurality of sensor sections 81 and a plurality of vertical CCDs 83. Arranged in the row (horizontal) and column (vertical) directions, i.e., in matrix form, the sensor sections 81 convert incident light into signal charges of amounts corresponding to light quantities of the incident light, and accumulate the signal charges thus produced. Provided for each vertical column of the sensor sections 81, each vertical CCD 83 vertically transfers signal charges read out from the sensor sections 81 by respective read gate sections 82.

In the imaging area 84, each sensor section 81 is a pn-junction photodiode, for instance. A signal charge accumulated in each sensor section 81 is read out to the associated vertical CCD 83 when a read pulse XSG is applied to the associated read gate section 82. The vertical CCDs 83 are transfer-driven by 4-phase vertical transfer clock signals $V\phi1-V\phi4$, for instance, and sequentially transfer portions of read-out signal charges in the vertical direction such that each portion corresponding to one scanning line (one line) is transferred in a portion of each horizontal blanking period.

A horizontal CCD 85 is disposed under the imaging area 84 (as viewed in FIG. 41). Signal charges are sequentially transferred from the plurality of vertical CCDs 83 to the horizontal CCD 85 such that signal charges corresponding to one line are transferred each time. Transfer-driven by 2-phase horizontal transfer clock signals $H\phi1$ and $H\phi2$, for instance, the horizontal CCD 85 sequentially transfers, in the horizontal direction, signal charges transferred from the vertical CCDs 13 such that signal charges of one line are transferred in a horizontal scanning period after the preceding horizontal blanking period.

Control gate sections (transfer control section) 86 are provided between the vertical CCDs 83 and the horizontal CCD 85. To prohibit transfer of signal charges from the vertical CCDs 83 to the horizontal CCD 85 selectively, i.e., in certain regions in the horizontal direction, both end regions in this example, the control gate sections 86 are provided to occupy both end regions in the horizontal direction in the imaging area 84.

In a normal imaging mode, the control gate sections 86 transfer, as they are, all of signal charges supplied from the vertical CCDs 83 line by line to the horizontal CCD 85. On the other hand, in a high-speed imaging mode, among signal charges supplied from the vertical CCDs 83 line by line, the control gate sections 86 transfer signal charges only in the central region to the horizontal CCD 85 while prohibiting signal charges in both end regions in the horizontal direction from being transferred to the horizontal CCD 85.

A charge-to-voltage conversion section 87 having a configuration of a floating diffusion amplifier, for instance, is provided at a transfer destination end of the horizontal CCD 85. The charge-to-voltage conversion section 87 sequentially converts signal charges that are horizontally transferred by the horizontal CCD 85 into a voltage signal and outputs it. The voltage signal is output as a CCD output signal which corresponds to the amount of incident light coming from an object.

An OPB 88 is disposed, for instance, on the right of the imaging area 84 at a given interval from the imaging area 84. The OPB 88 has a plurality of (in this embodiment, two) columns each being constituted of sensor sections 89 each being a pn-junction photodiode, for instance, and a vertical CCD 91 for vertically transferring charges read out from the sensor sections 89 by the read gate sections 90. The entire surface of the OPB 88 is optically shielded by a light interrupting layer (not shown) such as an aluminum layer. As already explained in the description of the operation in connection with FIG. 10, charges obtained in the OPB 88 are output so as to be added behind signal charges of each line.

Bus lines 92 for supplying 4-phase vertical transfer clock signals $V\phi1-V\phi4$ to the vertical CCDs 83 in the imaging area 84 and the vertical CCDs 91 in the OPB 88 and signal line 93 for supplying a control voltage V-Hold to the control gate sections 86 are wired in an area between the imaging area 84 and the OPB 88. To reduce propagation delays of the clock signals that increases with the wiring length, the vertical transfer clock signals Vφ1–Vφ4 are supplied to the imaging area 84 from both sides.

Since the OPB 88 is disposed at a given interval from the imaging area 84 as described above, the blank area therebetween can be used as the wiring area of the bus line 92 for supplying the 4-phase vertical transfer clock signals Vφ1–Vφ4 and the signal line 93 for supplying the control voltage V-Hold. Further, by using aluminum, the bus lines 92 and the signal line 93 can be formed in the same layer as the imaging area 84 and the light interrupting layer of the OPB 88. Alternatively, the wiring between the imaging area 84 and the OPB 88 may include only the signal line 93 for the control voltage V-Hold (and a signal line for a drain voltage V-Drain when this concept is applied to the second or third embodiment) with the bus lines 92 for the vertical transfer clock signals Vφ1–Vφ4 wired outside the OPB 88.

Although in this embodiment the OPB 88 is disposed on the right of the imaging area 84 and charges generated in the OPB 88 are added behind signals charges of each line, another configuration is possible in which the OPB 88 is disposed on the left of the imaging area 84 and charges generated in the OPB 88 are added before charges of each line. Disposing the OPB 88 on the left of the imaging area 84 is advantageous in efficiency because a portion of the horizontal CCD 85 under the area between the imaging area 84 and the OPB 88 (i.e., the wiring area) can be used as a buffer in a high-speed imaging mode slower than the 9-fold-speed imaging mode.

Although it was mentioned above that disposing the OPB 88 at a given interval from the imaging area 84 provides the advantage that the area therebetween can be used as the wiring area, the following advantage can be obtained even if the OPB 88 is not used as the wiring area. When the OPB 88 is disposed adjacent to the imaging area 84, even if the entire surface of the OPB 88 are shielded by the light interrupting layer, there unavoidably occurs leakage of light due to, for instance, inclined incidence of light from the imaging area 84 side and hence charges generated in a region of several pixels of the OPB 88 on the side of the imaging area 84 cannot be used for the intended purpose. In contrast, where the OPB 88 is disposed at a given interval from the imaging area 84, there occur no leakage of light from the imaging area 84 side and hence charges of all pixels generated in the OPB 88 can be used for the intended purpose.

Figure 42:
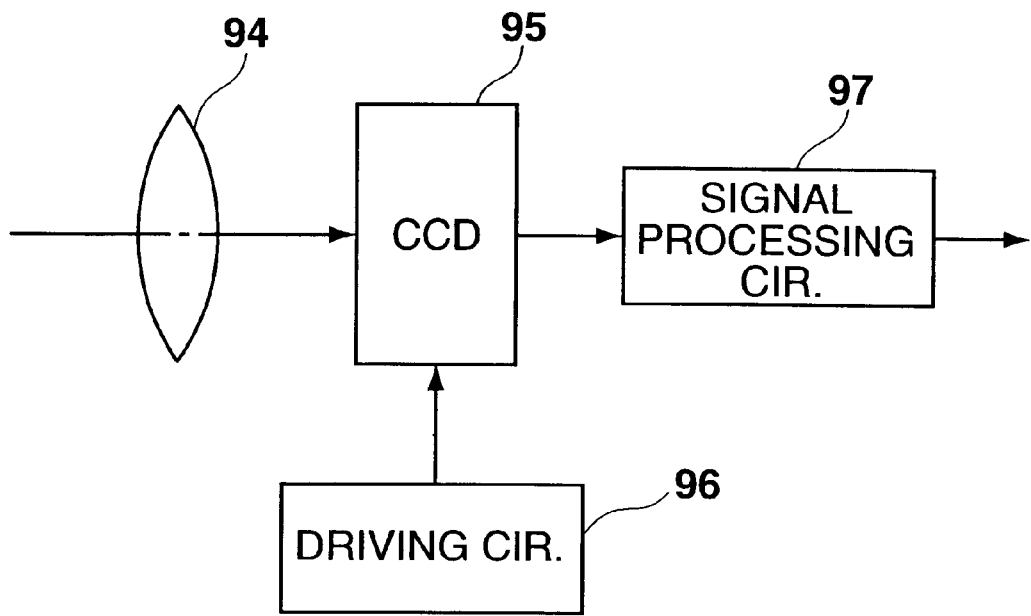
FIG. 42 is a general configuration of a camera according to the invention.

FIG. 42 shows a general configuration of a camera according to the invention. Referring to FIG. 42, light coming from an object is guided to the imaging area of a CCD solid-state imaging device 95 by an optical system such as a lens 94. The CCD solid-stage imaging device 95 may be one of the CCD solid-state imaging devices according to the first to sixth embodiments and their modifications. A driving circuit 96 performs various drive controls on the operations performed by the CCD solid-state imaging device 95, such as signal charge reading, vertical transfer, horizontal transfer, switching between the normal and high-speed imaging modes, and prevention of transfer of signal charges from the vertical CCDs and the horizontal CCD. A signal processing circuit 97 performs various kinds of signal processing on an imaging output of the CCD solid-state imaging device 95.

As described above, by using the CCD solid-state imaging device of the invention, in particular the CCD solid-state imaging devices of the first to fifth embodiments, as an imaging device, high-speed imaging can be performed with the screen center (optical center) serving as a reference, whereby the ease of operation is improved and center offsetting does not occur even in optical zooming. Further, with small power consumption, the CCD solid-state imaging device of the invention is suitable for battery driving.

As described above, in the solid-state imaging device according to one aspect of the invention, the transfer control section is provided which can prevent signal charges in a selected region of the imaging area in the horizontal direction from being transferred from the vertical transfer sections to the horizontal transfer section. As a result, since signal charges only in a particular region in the horizontal direction can be read out, high-speed imaging can be realized without increasing the drive frequency. The unnecessariness for increasing the drive frequency is advantageous in power consumption. Further, since the intended purposes can be attained merely by adding a terminal for supplying the control voltage V-Hold, the device structure remains simple.

The solid-state imaging device according to another aspect of the invention has the configuration in which signal charges only in a selected region in the vertical direction can be read out. Therefore, signal charges only in a particular region in the vertical direction can be read out. Since there is no need for performing an operation of vertically transferring at high speed and then sweeping out signal charges in the other region in the vertical direction, which is effective in eliminating time loss in high-speed imaging.

In the solid-state imaging device according to a further aspect of the invention, the optical black area is disposed at a given interval from the imaging area. Since there a blank area is interposed therebetween, there occurs no leakage of light due to, for instance, inclined incidence of light on sensor sections in a peripheral portion of the optical black area. In addition, the blank area can be used as a wiring area.

What is claimed is:

1. A solid-state imaging device comprising:
   a plurality of sensor sections arranged in matrix form, for performing photoelectric conversion;
   a reading section for reading signal charges obtained through the photoelectric conversion in the plurality of sensor sections;
   a vertical transfer section for vertically transferring to a horizontal transfer section a first row of signal charges to be used for forming an image, the first row of signal charges being read out from the sensor sections by the reading section;
   a horizontal transfer section for horizontally transferring the first row of signal charges from the vertical transfer section to a transfer control section; and
   a transfer control section capable of preventing transfer of signal charges from the vertical transfer section to the horizontal transfer section in a partial region in a horizontal direction, wherein the vertical transfer section transfers a second row of signal charges to the horizontal transfer section while the first row of signal charges is located in the transfer control section.

2. The solid-state imaging device according to claim 1, wherein the partial region is both end regions in the horizontal direction.

3. The solid-state imaging device according to claim 2, wherein the partial region occupies ½ or more of an overall horizontal length of an imaging area.

4. The solid-state imaging device according to claim 3, wherein the partial region occupies ⅔ or more of an overall horizontal length of an imaging area.

5. The solid-state imaging device according to claim 1, wherein the transfer control section comprises a transfer prohibiting section capable of selectively preventing transfer of signal charges from the vertical transfer section to the horizontal transfer section.

6. The solid-state imaging device according to claim 5, wherein the transfer control section further comprises a charge guiding section for causing signal charges that are transfer-prevented by the transfer prohibiting section and overflown from a transfer channel to flow into an adjacent transfer channel.

7. The solid-state imaging device according to claim 1, wherein the transfer control section comprises a transfer prohibiting section capable of selectively preventing transfer of signal charges from the vertical transfer section, to the horizontal transfer section and a charge ejecting section for discarding signal charges that are transfer-prevented by the transfer prohibiting section.

8. The solid-state imaging device according to claim 7, wherein the charge ejecting section comprises a drain section formed on the side of an imaging area and a charge guiding section for guiding to the drain section signal charges that are transfer-prevented by the transfer prohibiting section.

9. The solid-state imaging device according to claim 8, wherein the charge guiding section comprises a sweeping electrode that is controlled by a horizontal transfer clock signal for driving the horizontal transfer section.

10. The solid-state imaging device according to claim 9, wherein the sweeping electrode is so formed as to extend past a gate electrode of a final stage of the vertical transfer section and to be integral with an electrode of a transfer section of the horizontal transfer section.

11. The solid-state imaging device according to claim 9, wherein the sweeping electrode is so formed as to extend past a gate electrode of a final stage of the vertical transfer section and to be integral with an electrode of a storage section of the horizontal transfer section.

12. The solid-state imaging device according to claim 7, wherein the charge ejecting section comprises a drain section formed between adjacent transfer channels of the vertical transfer section and a charge guiding section for guiding to the drain section signal charges that are transfer-prevented by the transfer prohibiting section.

13. The solid-state imaging device according to claim 12, wherein the drain section is a portion of a substrate.

14. The solid-state imaging device according to claim 12, wherein the drain section is a contact section connected to a power supply or a substrate.

15. The solid-state imaging device according to claim 12, wherein the charge guiding section comprises a sweeping electrode that is controlled by a horizontal transfer clock signal for driving the horizontal transfer section.

16. The solid-state imaging device according to claim 15, wherein the sweeping electrode is so formed as to extend past a gate electrode of a final stage of the vertical transfer section and to be integral with an electrode of a transfer section of the horizontal transfer section.

17. The solid-state imaging device according to claim 15, wherein the sweeping electrode is so formed as to extend past a gate electrode of a final stage of the vertical transfer section and to be integral with an electrode of a storage section of the horizontal transfer section.

18. The solid-state imaging device according to claim 1, wherein the transfer control section comprises a charge ejecting section disposed in an imaging area between a final stage of the vertical transfer section and the horizontal transfer section and capable of selectively sweeping away signal charges transferred from the vertical transfer section.

19. A solid-state imaging device comprising:
a plurality of sensor sections arranged in matrix form, for performing photoelectric conversion;
a reading section for reading signal charges obtained through the photoelectric conversion in the plurality of sensor sections, the reading section being capable of reading out signal charges only in a parallel region in a vertical direction;
a vertical transfer section for vertically transferring to a horizontal transfer section a first row of signal charges to be used for forming an image, the first row of signal charges being read out from the sensor sections by the reading section;
a horizontal transfer section for horizontally transferring the first row of signal charges from the vertical transfer section to a transfer control section; and
a transfer control section capable of preventing transfer of signal charges from the vertical transfer section to the horizontal transfer section in a partial region in a horizontal direction, wherein the vertical transfer section transfers a second row of signal charges to the horizontal transfer section while the first row of signal charges is located in the transfer control section.

20. A camera comprising:
a solid-state imaging device comprising:
a plurality of sensor sections arranged in matrix form, for performing photoelectric conversion;
a vertical transfer section for vertically transferring a horizontal transfer section a first row of signal charges to be used for forming an image, the first row of signal charges being read out from the sensor sections;
a horizontal transfer section for horizontally transferring the first row of signal charges from the vertical transfer section to a transfer control section;
a transfer control section capable of preventing transfer of signal charges from the vertical transfer section to the horizontal transfer section in a partial region in the horizontal direction, wherein the vertical transfer section transfers a second row of signal charges to the horizontal transfer section while the first row of signal charges is located in the transfer control section; and
an optical system for guiding incident light to an imaging area of the solid-state imaging device.

21. The camera according to claim 20, wherein the camera is operable in both of a normal imaging mode and a high-speed imaging mode, and is switchable between the normal and high-speed imaging modes.

22. A driving method of a solid-state imaging device, comprising the steps of:
reading out, by a reading section, signal charges that are obtained through photoelectric conversion in a plurality of sensor sections arranged in matrix form;
vertically transferring to a horizontal transfer section and a horizontal transfer prevention region a first row of signal charges to be used for forming an image, the first row of signal charges being read out from the sensor sections by the reading section and moved to the vertical transfer section;
preventing the signal charges in the horizontal transfer prevention region from being transferred to the horizontal transfer section at least in a partial region by means of operation of a transfer control section capable of preventing such transfer of signal charges; and
horizontally transferring part of the signal charges in the vertical transfer section which have been in a region excluding the horizontal transfer prevention region.

23. The driving method according to claim 22, further comprising the step of ejecting charges in the horizontal transfer prevented region to a charge ejecting section.

24. The driving method according to claim 22, further comprising the step of reading out part of the signal charges obtained in the sensor sections through photoelectric conversion which part of the signal charges are only in a partial region in a vertical direction.

* * * * *